(12) United States Patent
Nakamura et al.

(10) Patent No.: US 12,410,507 B2
(45) Date of Patent: Sep. 9, 2025

(54) MASK GROUP, METHOD OF MANUFACTURING ORGANIC DEVICE AND ORGANIC DEVICE

(71) Applicant: Dai Nippon Printing Co., Ltd., Tokyo (JP)

(72) Inventors: Yusuke Nakamura, Tokyo (JP); Isao Miyatani, Tokyo (JP); Naoki Nishimura, Tokyo (JP); Hiroshi Yano, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 474 days.

(21) Appl. No.: 17/806,531

(22) Filed: Jun. 13, 2022

(65) Prior Publication Data
US 2022/0399503 A1    Dec. 15, 2022

(30) Foreign Application Priority Data

Jun. 14, 2021 (JP) .................................. 2021-098994
Mar. 10, 2022 (JP) .................................. 2022-037594

(51) Int. Cl.
*C23C 14/04* (2006.01)
*H10K 50/82* (2023.01)
(Continued)

(52) U.S. Cl.
CPC ........... *C23C 14/042* (2013.01); *H10K 50/82* (2023.02); *H10K 59/121* (2023.02); *H10K 59/65* (2023.02);
(Continued)

(58) Field of Classification Search
CPC ......... H01L 21/02636; H01L 21/02639; H01L 21/02642; H01L 21/0268; H01L 21/28562;
(Continued)

(56) References Cited

U.S. PATENT DOCUMENTS 10,873,028 B2 * 12/2020 Kim .................... H10K 71/166
2011/0037065 A1    2/2011 Ueno et al.
(Continued)

FOREIGN PATENT DOCUMENTS

JP    2005-183153 A    7/2005
JP    2010-272891 A    12/2010
(Continued)

OTHER PUBLICATIONS

KR 10-2021-0016161 A corresponds to U.S. Patent Application Publication No. 2021/0036070 A1.
(Continued)

*Primary Examiner* — Natalia A Gondarenko
(74) *Attorney, Agent, or Firm* — BURR PATENT LAW, PLLC

(57) ABSTRACT

A mask group may include two or more masks. When a section in a normal direction is viewed, a region-defining straight line may be defined as a straight line that forms an angle θ together with a first surface. The region-defining straight line may intersect the first surface at a first intersection point. An effective region may be defined as a region inside the first intersection point in the through-hole, and a peripheral region may be defined as a region outside the first intersection point in the through-hole. The angle θ may be 35° or more and 70° or less. The penetration region in the second mask region may include a hole overlapping region in which the through-holes of two masks overlap. The hole overlapping region may include a first hole overlapping region in which the peripheral regions of the through-holes of the two masks overlap.

5 Claims, 30 Drawing Sheets

(51) Int. Cl.
*H10K 59/121* (2023.01)
*H10K 59/65* (2023.01)
*H10K 59/80* (2023.01)
*H10K 71/00* (2023.01)

(52) U.S. Cl.
CPC ....... *H10K 59/80521* (2023.02); *H10K 71/00* (2023.02); *H10K 71/621* (2023.02)

(58) Field of Classification Search
CPC ............. H01L 21/32139; C23C 16/042; C23C 14/042; C23C 14/24; H10K 50/11; H10K 50/82; H10K 59/121; H10K 59/65; H10K 59/352; H10K 59/353; H10K 59/80521; H10K 71/00; H10K 71/166; H10K 71/621
USPC ..................... 257/40; 118/504; 427/282, 331
See application file for complete search history.

(56) References Cited

U.S. PATENT DOCUMENTS

| | | |
|---|---|---|
| 2011/0163327 A1 | 7/2011 | Ueno et al. |
| 2012/0146010 A1 | 6/2012 | Ueno et al. |
| 2014/0008638 A1 | 1/2014 | Otsuki et al. |
| 2016/0293844 A1* | 10/2016 | Takeda .................. C23C 16/042 |
| 2019/0259951 A1 | 8/2019 | Seong et al. |
| 2019/0378983 A1 | 12/2019 | Kim et al. |
| 2020/0381489 A1 | 12/2020 | Hwang et al. |
| 2021/0028248 A1 | 1/2021 | Kim et al. |
| 2021/0036070 A1 | 2/2021 | Jeon et al. |
| 2021/0071289 A1 | 3/2021 | Kishimoto |
| 2021/0371968 A1 | 12/2021 | Higuchi et al. |
| 2022/0098718 A1* | 3/2022 | Han ..................... C23C 14/042 |

FOREIGN PATENT DOCUMENTS

| | | |
|---|---|---|
| JP | 2011-119681 A | 6/2011 |
| JP | WO2012/018082 A1 | 2/2012 |
| JP | 2012-069963 A | 4/2012 |
| JP | 2019-060028 A | 4/2019 |
| JP | 2021-055165 A | 4/2021 |
| KR | 10-2018-0089827 A | 8/2018 |
| KR | 10-2021-0016161 A | 2/2021 |
| WO | 2012/132126 A1 | 10/2012 |
| WO | 2020/158566 A1 | 8/2020 |
| WO | 2021/098304 A1 | 5/2021 |

OTHER PUBLICATIONS

International Publication No. WO 2020/158566 A1 corresponds to U.S. Patent Application Publication No. 2021/0371968 A1.
Japanese Patent Publication No. 2010-272891 A corresponds to U.S. Patent Application Publication No. 2011/0037065 A1.
International Publication No. WO 2012/132126 A1 corresponds to U.S. Patent Application Publication No. 2014/0008638 A1.
Japanese Patent Publication No. 2011-119681 A corresponds to U.S. Patent Application Publication No. 2012/0146010 A1.
Japanese Patent Publication No. 2012-069963 A corresponds to U.S. Patent Application Publication No. 2011/0163327 A1.
Korean Office Action (with English translation) dated Mar. 11, 2025 (Application No. 10-2022-0071946).
Taiwanese Office Action (with English translation) dated Jan. 17, 2025 (Application No. 111121937).
Extended European Search Report (Application No. 22178943.1) dated Nov. 21, 2022 (12 pages).

* cited by examiner

MASK GROUP, METHOD OF MANUFACTURING ORGANIC DEVICE AND ORGANIC DEVICE

CROSS REFERENCES TO RELATED APPLICATIONS

This application is based upon and claims the benefit of priority from Japanese Patent Application No. 2021-098994 filed on Jun. 14, 2021 and Japanese Patent Application No. 2022-037594 filed on Mar. 10, 2022, the entire contents of which are incorporated herein by reference.

FIELD

An embodiment of the present disclosure relates to a mask group, a method of manufacturing an organic device, and an organic device.

BACKGROUND

For electronic devices such as smart phones and tablet PCs, there has been a need for high-definition display devices in markets. A display device has a pixel density of, for example, 400 ppi or more or 800 ppi or more.

An organic electroluminescent display device attracts attention because of excellent responsiveness and/or low power consumption. A known method of forming pixels of the organic electroluminescent display device is to attach the material of the pixels to a substrate by deposition. For example, a substrate on which an anode is formed in a pattern suitable for an element is first prepared. Subsequently, an organic material is attached to the anode via a through-hole in a mask, and an organic layer is formed on the anode. Subsequently, a conductive material is attached to the organic layer via the through-hole of the mask, and a cathode is formed on the organic layer.

In some cases, the cathode is formed by using a deposition method in which multiple masks are used. In these cases, layers that are included in the cathode are formed by the masks, and adjacent layers overlap in an electrode overlapping region. Consequently, the layers are electrically connected to each other.

Patent Document 1: JP 2019-060028 A
Patent Document 2: JP 2005-183153 A

DISCLOSURE

As the thickness of the electrode overlapping region of the cathode increases, optical transmittance decreases.

A mask group according to an embodiment of the present disclosure may include two or more masks. The mask may include a shield region and a through-hole. A mask multilayer body in which the two or more masks are stacked may have a penetration region that overlaps the through-hole when viewed in a normal direction of the masks. The mask multilayer body may have a first mask region that contains the penetration region that has a first aperture ratio and a second mask region that contains the penetration region that has a second aperture ratio lower than the first aperture ratio when viewed in the normal direction of the masks. The masks may have a first surface and a second surface that is located opposite the first surface. The through-hole may include a first recessed portion that is located at the first surface, a second recessed portion that is located at the second surface, and a connection portion at which the first recessed portion and the second recessed portion are connected to each other. When a section in the normal direction is viewed, a region-defining straight line may be defined as a straight line that passes through the connection portion and that forms an angle θ together with the first surface, the region-defining straight line may intersect the first surface at a first intersection point, an effective region may be defined as a region inside the first intersection point in the through-hole, and a peripheral region may be defined as a region outside the first intersection point in the through-hole. The angle θ may be 35° or more and 70° or less. The penetration region in the second mask region may include a hole overlapping region in which the through-holes of the two masks overlap. The hole overlapping region may include a first hole overlapping region in which the peripheral regions of the through-holes of the two masks that are included in the mask multilayer body overlap.

According to an embodiment of the present disclosure, optical transmittance can be increased.

DETAILED DESCRIPTION

Figure 1:
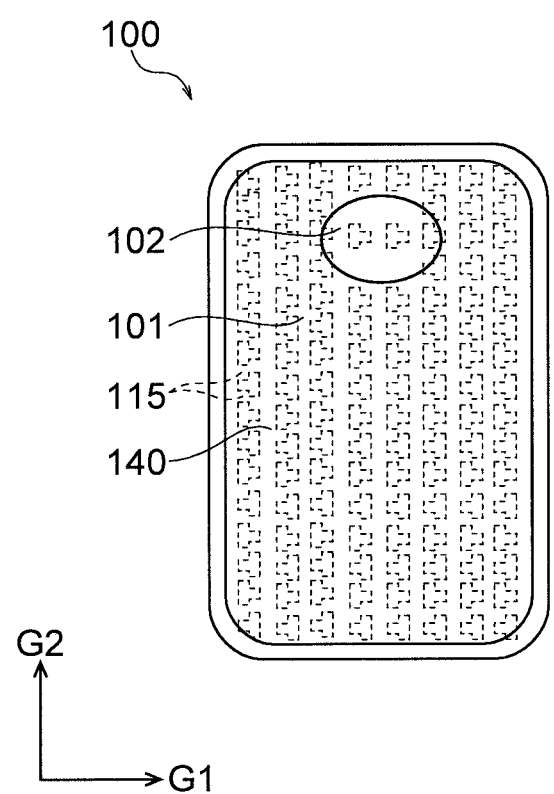
FIG. 1 is a plan view of an example of an organic device according to an embodiment of the present disclosure.

In the present specification and the drawings, words that mean substances on which components such as a "substrate", a "base material", a "plate", a "sheet", and a "film" are based are not distinguished from each other only based on different names unless there is a particular description.

In the present specification and the drawings, words such as "parallel" and "perpendicular" and the values of a length and an angle that specify shapes, geometrical conditions, and the degree of these, for example, are not limited by strict meaning but are interpreted to an extent that the same function can be expected unless there is a particular description.

In some cases where a component such as a member or a region is "on" or "under", "on an upper side of" or "on a lower side of", or "above" or "below" another component such as another member or another region in the present specification and the drawings, the cases include a case where the component is in direct contact with the other component unless there is a particular description. The cases also include a case where another component is between the component and the other component, that is, a case where the component and the other component are indirectly connected to each other. As for the words "on", "upper side", and "above", or "under", "lower side", and "below", an up-down direction may be reversed unless there is a particular description.

In the present specification and the drawings, like portions or portions that have the same function are designated by like reference characters or similar reference characters unless there is a particular description, and a duplicated description for these is omitted in some cases. For convenience of description, the ratio of dimensions in the drawings differs from an actual ratio, and an illustration of a part of a component is omitted in the drawings in some cases.

In the present specification and the drawings, an embodiment of the present disclosure may be combined with another embodiment or a modification without contradiction unless there is a particular description. Other embodiments may be combined with each other, and another embodiment and a modification may be combined with each other without contradiction. Modifications may be combined with each other without contradiction.

In the case where multiple processes related to a method such as a manufacturing method are disclosed in the present specification and the drawings, another process that is not disclosed may be performed between the disclosed processes unless there is a particular description. The order of the disclosed processes is freely selected without contradiction.

In the present specification and the drawings, a range that is represented by the character "to" includes numerals or factors placed in front of and behind the character "to" unless there is a particular description. For example, the numerical range that is defined by the expression "34 to 38 mass %" is the same as the numerical range that is defined by the expression "34 mass % or more and 38 mass % or less". For example, the range that is defined by the expression "masks 50A to 50C" includes masks 50A, 50B, and 50C.

According to an embodiment of the present specification, an example of the use of a mask group that includes multiple masks to form an electrode on a substrate when an organic electroluminescent display device is manufactured will be described. However, the use of the mask group is not particularly limited. The present embodiment can be used for mask groups that are used in various ways. For example, the mask group according to the present embodiment may be used to form an electrode of a device that displays or projects an image or a picture for creating virtual reality, that is, VR or augmented reality, that is, AR. The mask group according to the present embodiment may be used to form an electrode of a display device other than an organic electroluminescent display device such as an electrode of a liquid-crystal display device. The mask group according to the present embodiment may be used to form an electrode of an organic device other than a display device such as an electrode of a pressure sensor.

According to a first aspect of the present disclosure, a mask group includes two or more masks. The mask includes a shield region and a through-hole. A mask multilayer body in which the two or more masks are stacked has a penetration region that overlaps the through-hole when viewed in a normal direction of the mask. The mask multilayer body has a first mask region that contains the penetration region that has a first aperture ratio and a second mask region that contains the penetration region that has a second aperture ratio lower than the first aperture ratio when viewed in the normal direction of the mask. The mask has a first surface and a second surface that is located opposite the first surface. The through-hole includes a first recessed portion that is located at the first surface, a second recessed portion that is located at the second surface, and a connection portion at which the first recessed portion and the second recessed portion are connected to each other. When a section in the normal direction is viewed, a region-defining straight line is defined as a straight line that passes through the connection portion and that forms an angle θ together with the first surface, the region-defining straight line intersects the first surface at a first intersection point, an effective region is defined as a region inside the first intersection point in the through-hole, and a peripheral region is defined as a region outside the first intersection point in the through-hole. The angle θ is 35° or more and 70° or less. The penetration region in the second mask region includes a hole overlapping region in which the through-holes of the two masks overlap. The hole overlapping region includes a first hole overlapping region in which the peripheral regions of the through-holes of the two masks that are included in the mask multilayer body overlap.

According to a second aspect of the present disclosure, in the mask group according to the first aspect described above, the first hole overlapping region may be separated from the effective region of the through-holes of the mask.

According to a third aspect of the present disclosure, in the mask group according to the first aspect described above, the hole overlapping region may include a second hole overlapping region in which the effective region of the through-hole of one of the masks that are included in the mask multilayer body and the peripheral region of the through-hole of another of the masks overlap.

According to a fourth aspect of the present disclosure, in the mask group according to any one of the first aspect described above to the third aspect described above, the region-defining straight line may be in contact with a freely selected point on a wall surface of the second recessed portion.

According to a fifth aspect of the present disclosure, in the mask group according to any one of the first aspect described above to the fourth aspect described above, the two or more masks may include a plurality of the through-holes in the first mask region and the second mask region.

According the sixth aspect of the present disclosure, a method of manufacturing an organic device may include a second electrode formation step of forming a second electrode on an organic layer on a first electrode on a substrate by using the mask group according to any one of the first aspect described above to the fifth aspect described above. The second electrode formation step may include forming a first layer of the second electrode by using a deposition method in which one of the masks is used and forming a second layer of the second electrode by using a deposition method in which another of the masks is used.

According to a seventh aspect of the present disclosure, in the method according to the sixth aspect described above, an angle θ of the region-defining straight line may be equal to an angle θ1. θ1 may be an angle that is formed between the first surfaces of the mask and a coming direction in which a deposition material for forming the second electrode comes. θ2 may be an angle that is formed between the first surfaces and a straight line that passes through the connection portion and that is in contact with the second recessed portion. The angle θ1 is larger than the angle θ2.

According to an eighth aspect of the present disclosure, an organic device includes a substrate, a first electrode that is located on the substrate, organic layers that are located on the first electrode, and a second electrode that is located on the organic layers. The organic device has a first display region that contains the second electrode that has a first occupancy ratio and a second display region that contains the second electrode that has a second occupancy ratio lower than the first occupancy ratio when viewed in a normal direction of the substrate. The second electrode includes two or more layers that are located on the organic layers that differ from each other. The layer has a main layer region and a peripheral layer region thinner than the main layer region. The second electrode in the second display region has an electrode overlapping region in which the two layers overlap. The electrode overlapping region includes a first electrode overlapping region in which the peripheral layer regions of the layers overlap and a second electrode overlapping region in which the main layer region of one of the layers and the peripheral layer region of another of the layers overlap.

An embodiment of the present disclosure will be described in detail with reference to the drawings. The embodiment described below is an example of an embodiment of the present disclosure, and the present disclosure is not interpreted so as to be limited to only the embodiment.

An organic device 100 will be described. The organic device 100 includes an electrode that is formed by using a mask group according to the present embodiment. FIG. 1 is a plan view of an example of the organic device 100 viewed in the normal direction of a substrate 110 of the organic device 100. In the following description, viewing a surface of a substance on which the substrate, for example, is based in the normal direction is also referred to as "in a plan view".

The organic device 100 includes the substrate 110 (see FIG. 5) and multiple elements 115 that are arranged on a first surface 111 or a second surface 112 of the substrate 110. For example, the elements 115 are pixels. As illustrated in FIG. 1, the organic device 100 may have a first display region 101 and a second display region 102 in a plan view. The second display region 102 may have an area smaller than that of the first display region 101. As illustrated in FIG. 1, the second display region 102 may be surrounded by the first display region 101. A part of an outer edge of the second display region 102 may be located on the same straight line as a part of an outer edge of the first display region 101 although this is not illustrated.

Figure 2:
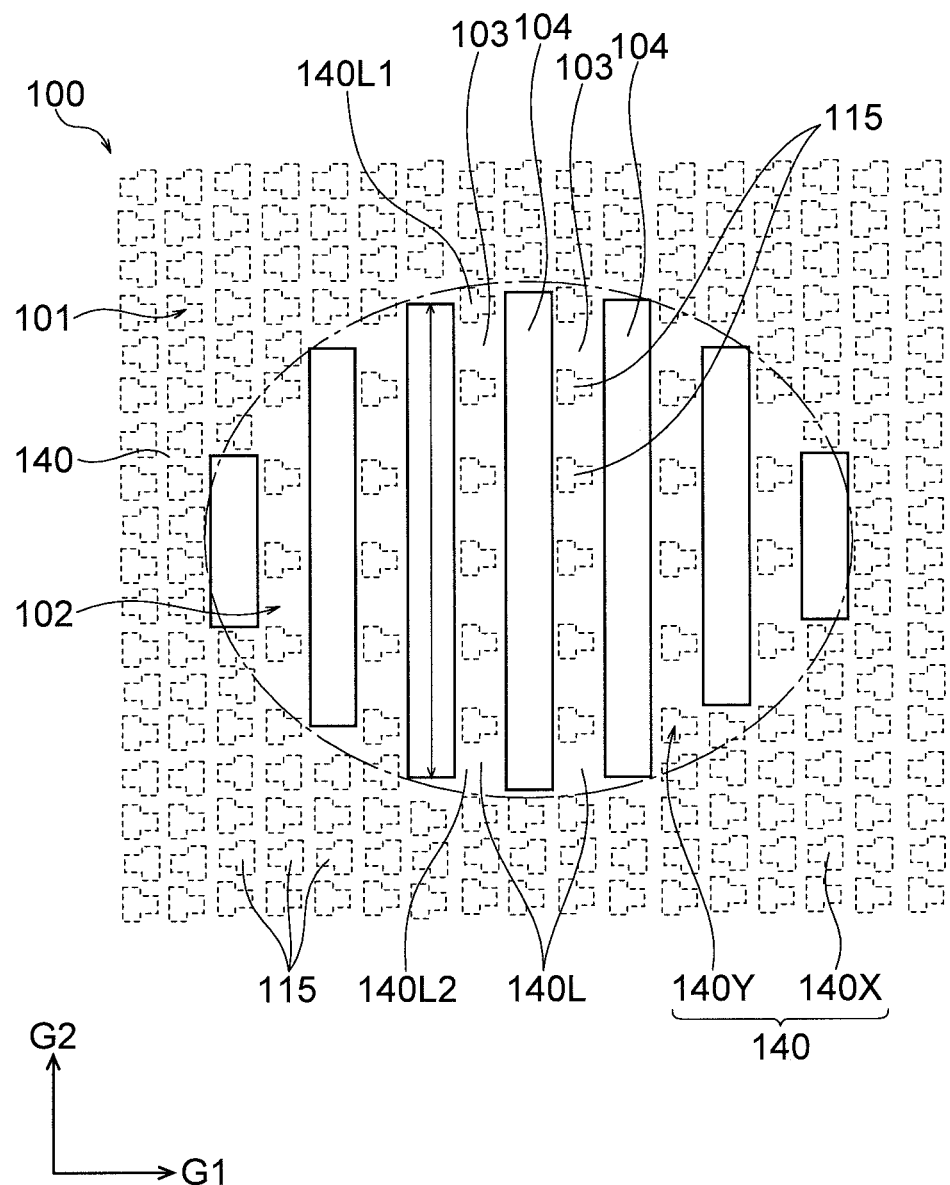
FIG. 2 is a plan view of a second display region of the organic device.

FIG. 2 is an enlarged plan view of the second display region 102 and the vicinity thereof in FIG. 1. In the first display region 101, the elements 115 may be arranged in two different directions. In an example illustrated in FIG. 1 and FIG. 2, two or more elements 115 in the first display region 101 may be arranged in a first element direction G1. Two or more elements 115 in the first display region 101 may be arranged in a second element direction G2 that intersects the first element direction G1. The second element direction G2 may be perpendicular to the first element direction G1.

The organic device 100 includes a second electrode 140. The second electrode 140 is located on organic layers 130 described later. The second electrode 140 may be electrically connected to two or more organic layers 130. For example, the second electrode 140 may overlap the two or more organic layers 130 in a plan view. The second electrode 140 that is located in the first display region 101 is also referred to as second electrode 140X. The second electrode 140 that is located in the second display region 102 is also referred to as second electrode 140Y.

The second electrode 140X has a first occupancy ratio. The first occupancy ratio is calculated by dividing the sum of the areas of the second electrode 140 that is located in the first display region 101 by the area of the first display region 101. The second electrode 140Y has a second occupancy ratio. The second occupancy ratio is calculated by dividing the sum of the areas of the second electrode 140 that is located in the second display region 102 by the area of the second display region 102. The second occupancy ratio may be lower than the first occupancy ratio. For example, as illustrated in FIG. 2, the second display region 102 may include non-transparent regions 103 and transparent regions 104. The transparent region 104 do not overlap the second electrode 140Y in a plan view. The non-transparent region 103 overlap the second electrode 140Y in a plan view.

The first occupancy ratio may be higher than 0% and lower than 100%. In this case, the first display region 101 includes a region that is occupied by any of first layers 140A to third layers 140C of the second electrode 140 described later and a region that is occupied by none of the first layers 140A to the third layers 140C. However, the present disclosure is not limited thereto. The first occupancy ratio may be 100%. In this case, the entire first display region 101 is occupied by any of the first layers 140A to the third layers 140C of the second electrode 140. The second occupancy ratio may be higher than 0% and lower than 100%. In this case, the second display region 102 includes a region that is occupied by any of the first layers 140A to the third layers 140C of the second electrode 140 and a region that is occupied by none of the first layers 140A to the third layers 140C.

For example, the ratio of the second occupancy ratio to the first occupancy ratio may be 0.2 or more, may be 0.3 or more, or may be 0.4 or more. For example, the ratio of the second occupancy ratio to the first occupancy ratio may be 0.6 or less, may be 0.7 or less, or may be 0.8 or less. The range of the ratio of the second occupancy ratio to the first occupancy ratio may be determined by using a first group consisting of 0.2, 0.3, and 0.4 and/or a second group consisting of 0.6, 0.7, and 0.8. The range of the ratio of the second occupancy ratio to the first occupancy ratio may be determined by using a combination of a value freely selected from the values in the first group described above and a value freely selected from the values in the second group described above. The range of the ratio of the second occupancy ratio to the first occupancy ratio may be determined by using a combination of two values freely selected from the values in the first group described above. The range of the ratio of the second occupancy ratio to the first occupancy ratio may be determined by using a combination of two values freely selected from the values in the second group described above. For example, the range may be 0.2 or more and 0.8 or less, may be 0.2 or more and 0.7 or less, may be 0.2 or more and 0.6 or less, may be 0.2 or more and 0.4 or less, may be 0.2 or more and 0.3 or less, may be 0.3 or more and 0.8 or less, may be 0.3 or more and 0.7 or less, may be 0.3 or more and 0.6 or less, may be 0.3 or more and 0.4 or less, may be 0.4 or more and 0.8 or less, may be 0.4 or more and 0.7 or less, may be 0.4 or more and 0.6 or less, may be 0.6 or more and 0.8 or less, may be 0.6 or more and 0.7 or less, or may be 0.7 or more and 0.8 or less.

The transmittance of the non-transparent region 103 is also referred to as a first transmittance. The transmittance of the transparent region 104 is also referred to as a second transmittance. The transparent region 104 do not contain the second electrode 140Y, and accordingly, the second transmittance is higher than the first transmittance. For this reason, in the second display region 102 including the transparent regions 104, light that reaches the organic device 100 passes through the transparent region 104 and can reach, for example, an optical component at the back of the substrate 110. An example of the optical component is a component that detects light to perform a function such as a camera. The second display region 102 includes the non-transparent regions 103, and accordingly, a picture can be displayed in the second display region 102 in the case where the elements 115 are pixels. The second display region 102 can thus detect light and display a picture. Examples of the function of the second display region 102 that is performed by detecting light include those of a camera and a sensor such as a fingerprint sensor or a face recognition sensor. The amount of light that is received by the sensor can be increased by increasing the second transmittance of the transparent region 104. The amount of light that is received by the sensor can be increased by decreasing the second occupancy ratio of the second display region 102.

In the case where any one of the dimensions of the non-transparent regions 103 in the first element direction G1 and in the second element direction G2 and the dimensions of the transparent regions 104 in the first element direction G1 and in the second element direction G2 is 1 mm or less, the first transmittance and the second transmittance may be measured by using a microspectrophotometer. OSP-SP200 manufactured by Olympus Corporation or any one of LCF series manufactured by Otsuka Electronics Co., Ltd., may be used as the microspectrophotometer. These microspectrophotometers can measure transmittance in a visible range of 380 nm or more and 780 nm or less. Quartz, borosilicate glass for TFT liquid crystal, or alkali glass for TFT liquid crystal may be used as reference. The result of measurement at 550 nm may be used as the first transmittance and the second transmittance.

In the case where any one of the dimensions of the non-transparent regions 103 in the first element direction G1 and in the second element direction G2 and the dimensions of the transparent regions 104 in the first element direction G1 and in the second element direction G2 is more than 1 mm, the first transmittance and the second transmittance may be measured by using a spectrophotometer. Ultraviolet visible light spectrophotometer UV-2600i or UV-3600i Plus manufactured by SHIMADZU CORPORATION may be used as the spectrophotometer. A fine luminous flux diaphragm unit is mounted on the spectrophotometer. This enables the transmittance of a region that has a dimension of 1 mm at the maximum to be measured. The atmosphere may be used as reference. The result of measurement at 550 nm may be used as the first transmittance and the second transmittance.

For example, a ratio TR2/TR1 of a second transmittance TR2 to a first transmittance TR1 may be 1.2 or more, may be 1.5 or more, or may be 1.8 or more. For example, the TR2/TR1 may be 2 or less, may be 3 or less, or may be 4 or less. The range of the TR2/TR1 may be determined by using a first group consisting of 1.2, 1.5, and 1.8 and/or a second group consisting of 2, 3, and 4. The range of the TR2/TR1 may be determined by using a combination of a value freely selected from the values in the first group described above and a value freely selected from the values in the second group described above. The range of the TR2/TR1 may be determined by using a combination of two values freely selected from the values in the first group described above. The range of the TR2/TR1 may be determined by using a combination of two values freely selected from the values in the second group described above. For example, the range may be 1.2 or more and 4 or less, may be 1.2 or more and 3 or less, may be 1.2 or more and 2 or less, may be 1.2 or more and 1.8 or less, may be 1.2 or more and 1.5 or less, may be 1.5 or more and 4 or less, may be 1.5 or more and 3 or less, may be 1.5 or more and 2 or less, may be 1.5 or more and 1.8 or less, may be 1.8 or more and 4 or less, may be 1.8 or more and 3 or less, may be 1.8 or more and 2 or less, may be 2 or more and 4 or less, may be 2 or more and 3 or less, or may be 3 or more and 4 or less.

As illustrated in FIG. 2, the second electrode 140Y may include two or more electrode lines 140L that are arranged in the first element direction G1. The electrode lines 140L may extend in the second element direction G2. For example, the electrode line 140L may have first end 140L1 and second end 140L2 that are connected to the second electrode 140X in the first display region 101. The second end 140L2 is located opposite the first end 140L1 in the second element direction G2. In the case where a part of the outer edge of the second display region 102 is located on the same straight line as a part of the outer edge of the first display region 101 although this is not illustrated, only one of the ends of the electrode line 140L may be connected to the second electrode 140X.

Figure 3:
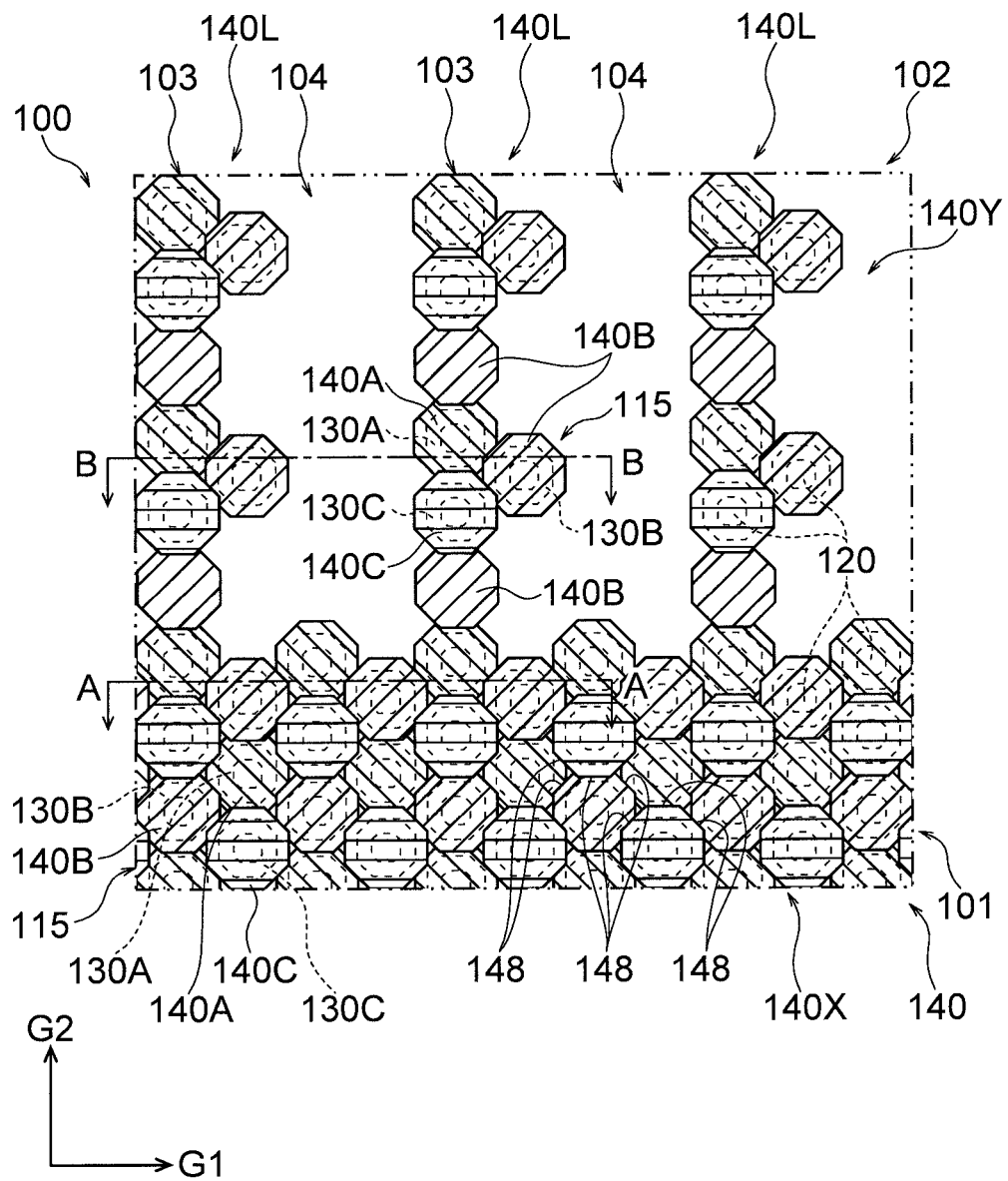
FIG. 3 is a plan view of second electrode of the organic device.

FIG. 3 is an enlarged plan view of the second electrode 140X in the first display region 101 and the second electrode 140Y in the second display region 102. The second electrode 140X and the second electrode 140Y may overlap the organic layers 130 in a plan view. The organic layers 130 are components of the elements 115.

In the first display region 101, the organic layers 130 may be arranged at a first pitch P1 (see FIG. 4) in the first element direction G1. In the second display region 102, the organic layers 130 may be arranged at a second pitch P2 in the first element direction G1. The second pitch P2 may be larger than the first pitch P1. Consequently, the second occupancy ratio of the second electrode 140Y decreases. This enables the areas of the transparent region 104 to increase and enables the amount of light that is received by the sensor to increase.

For example, the ratio of the second pitch P2 to the first pitch P1 may be 1.1 or more, may be 1.3 or more, or may be 1.5 or more. For example, the ratio of the second pitch P2 to the first pitch P1 may be 2.0 or less, may be 3.0 or less, or may be 4.0 or less. The range of the ratio of the second pitch P2 to the first pitch P1 may be determined by using a first group consisting of 1.1, 1.3, and 1.5 and/or a second group consisting of 2.0, 3.0, and 4.0. The range of the ratio of the second pitch P2 to the first pitch P1 may be determined by using a combination of a value freely selected from the values in the first group described above and a value freely selected from the values in the second group described above. The range of the ratio of the second pitch P2 to the first pitch P1 may be determined by using a combination of two values freely selected from the values in the first group described above. The range of the ratio of the second pitch P2 to the first pitch P1 may be determined by using a combination of two values freely selected from the values in the second group described above. For example, the range may be 1.1 or more and 4.0 or less, may be 1.1 or more and 3.0 or less, may be 1.1 or more and 2.0 or less, may be 1.1 or more and 1.5 or less, may be 1.1 or more and 1.3 or less, may be 1.3 or more and 4.0 or less, may be 1.3 or more and 3.0 or less, may be 1.3 or more and 2.0 or less, may be 1.3 or more and 1.5 or less, may be 1.5 or more and 4.0 or less, may be 1.5 or more and 3.0 or less, may be 1.5 or more and 2.0 or less, may be 2.0 or more and 4.0 or less, may be 2.0 or more and 3.0 or less, or may be 3.0 or more and 4.0 or less. In the case where the ratio of the second pitch P2 to the first pitch P1 is small, a difference between the pixel density of the first display region 101 and the pixel density of the second display region 102 is small. This inhibits a visual difference between the first display region 101 and the second display region 102 from being made.

The electrode line 140L may overlap the two or more organic layers 130 that are arranged in the second element direction G2 in a plan view.

Layered structures of the second electrode 140 will be described.

The second electrode 140 may include multiple layers. For example, the second electrode 140 may include the first layers 140A, the second layers 140B, and the third layers 140C. The first layers 140A, the second layers 140B, and the third layers 140C are formed by using a deposition method. More specifically, the first layers 140A are formed by using the deposition method in which a first mask 50A is used. The second layers 140B are formed by using the deposition method in which a second mask 50B is used. The third layers 140C are formed by using the deposition method in which a third mask 50C is used.

Figure 7:
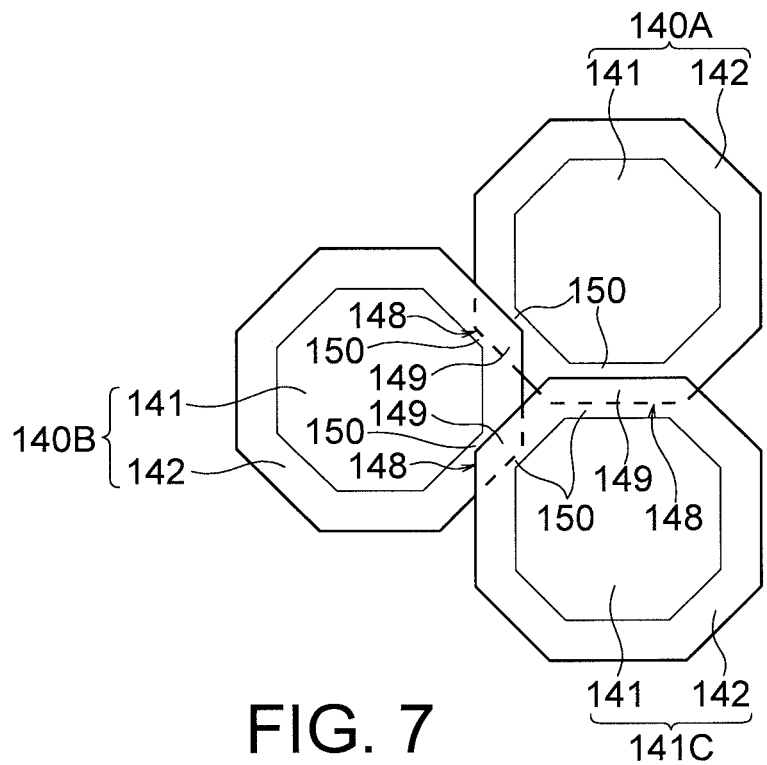
FIG. 7 is a plan view of electrode overlapping regions of the second electrode illustrated in FIG. 3.
Figure 8:
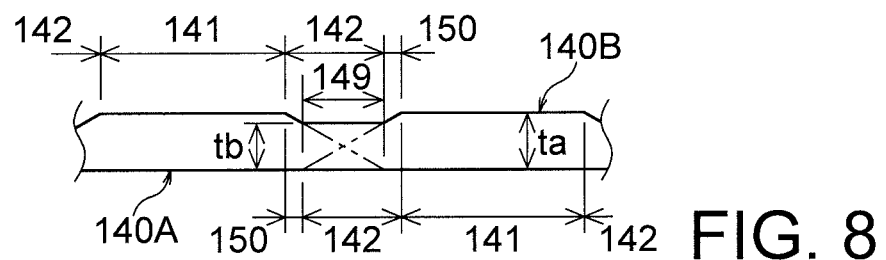
FIG. 8 is a sectional view of the electrode overlapping regions illustrated in FIG. 7.

As illustrated in FIG. 7 and FIG. 8, each of the layers 140A to 140C of the second electrode 140 has main layer region 141 and peripheral layer region 142.

The main layer region 141 is located at the centers of the layer in a plan view and are unlikely to be affected by shadow described later. The main layer region 141 is thicker than the peripheral layer region 142. The main layer region 141 may be relatively flat. The main layer region 141 may be defined by effective region 57 of through-hole 53 described later.

The peripheral layer region 142 is located outside the main layer region 141 and around the main layer region 141. The peripheral layer region 142 is likely to be affected by the shadow. The peripheral layer region 142 is thinner than the main layer region 141. The thickness of the peripheral layer region 142 may vary. The peripheral layer region 142 may be defined by peripheral region 58 of the through-hole 53 described later.

The peripheral layer region 142 may have a thickness of 95% or less of the thickness ta of the main layer region 141. That is, the thickness of the peripheral layer region 142 may change within a range of 95% or less of the thickness ta of the main layer region 141. For example, the percentage of the thickness to the thickness ta may be 80% or less or 50% or less.

The layers 140A to 140C of the second electrode 140 may have a contour that has a substantially polygonal shape in a plan view or a contour that has a substantially circular shape. For example, the layers may have a contour that has a substantially quadrilateral shape, a substantially hexagonal shape, or a substantially octagonal shape. In an example illustrated in FIG. 3, the layers 140A to 140C have a contour that has a substantially regular octagonal shape. The layers 140A to 140C may have the same planar contour. Two sides that face each other extend in the first element direction G1. Other two sides that face each other extend in the second element direction G2. In the case where the layers 140A to 140C have a contour that has a substantially polygonal shape, four corners of the contour may be curved.

The first layer 140A may be connected to the second layer 140B and the third layer 140C in the first element direction G1 and in the second element direction G2. The first layer 140A may overlap the organic layer 130 in a plan view. For example, the first layer 140A may overlap first organic layer 130A described later. The first layer 140A may be located on the organic layer 130 that differ from those on which the second layer 140B and the third layer 140C are located.

The second layer 140B may be connected to the first layer 140A and the third layer 140C in the first element direction G1 and in the second element direction G2. The second layer 140B may overlap the organic layer 130 in a plan view. For example, the second layer 140B may overlap second organic layer 130B described later. The second layer 140B may be located on the organic layer 130 that differ from those on which the first layer 140A and the third layer 140C are located.

The third layer 140C may be connected to the first layer 140A and the second layer 140B in the first element direction G1 and in the second element direction G2. The third layer 140C may overlap the organic layer 130 in a plan view. For example, the third layer 140C may overlap third organic layer 130C described later. The third layer 140C may be located on the organic layer 130 that differ from those on which the first layer 140A and the second layer 140B are located.

In the first display region 101, the first layers 140A, the second layers 140B, and the third layers 140C may be continuously arranged in the first element direction G1 and in the second element direction G2. In the example illustrated in FIG. 3, the first layer 140A, the second layer 140B, and the third layer 140C are located on vertices of an equilateral triangle. A single pixel is configured by three layers 140A, 140B, and 140C located above, as well as the first electrode 120 and the organic layer 130.

In the second display region 102, the first layers 140A, the second layers 140B, and the third layers 140C may be continuously arranged in the first element direction G1 and in the second element direction G2. In the example illustrated in FIG. 3, a single pixel is configured by three layers 140A, 140B, and 140C that are located on vertices of an equilateral triangle as in the first display region 101. The pixels are arranged at an interval in the first element direction G1. The transparent region 104 are interposed between the adjacent pixels in the first element direction G1. The pixels are arranged at an interval in the second element direction G2. The second layer 140B is interposed between two adjacent pixels in the second element direction G2. The first electrode 120 and the organic layer 130 are not associated with the second layer 140B, and insulating layers 160 are interposed between the second layer 140B that are not included in the pixels and the substrate 110. The second layers 140B that are not included in the pixels form the electrode lines 140L and ensure the conductivity of the second electrode 140.

Figure 4:
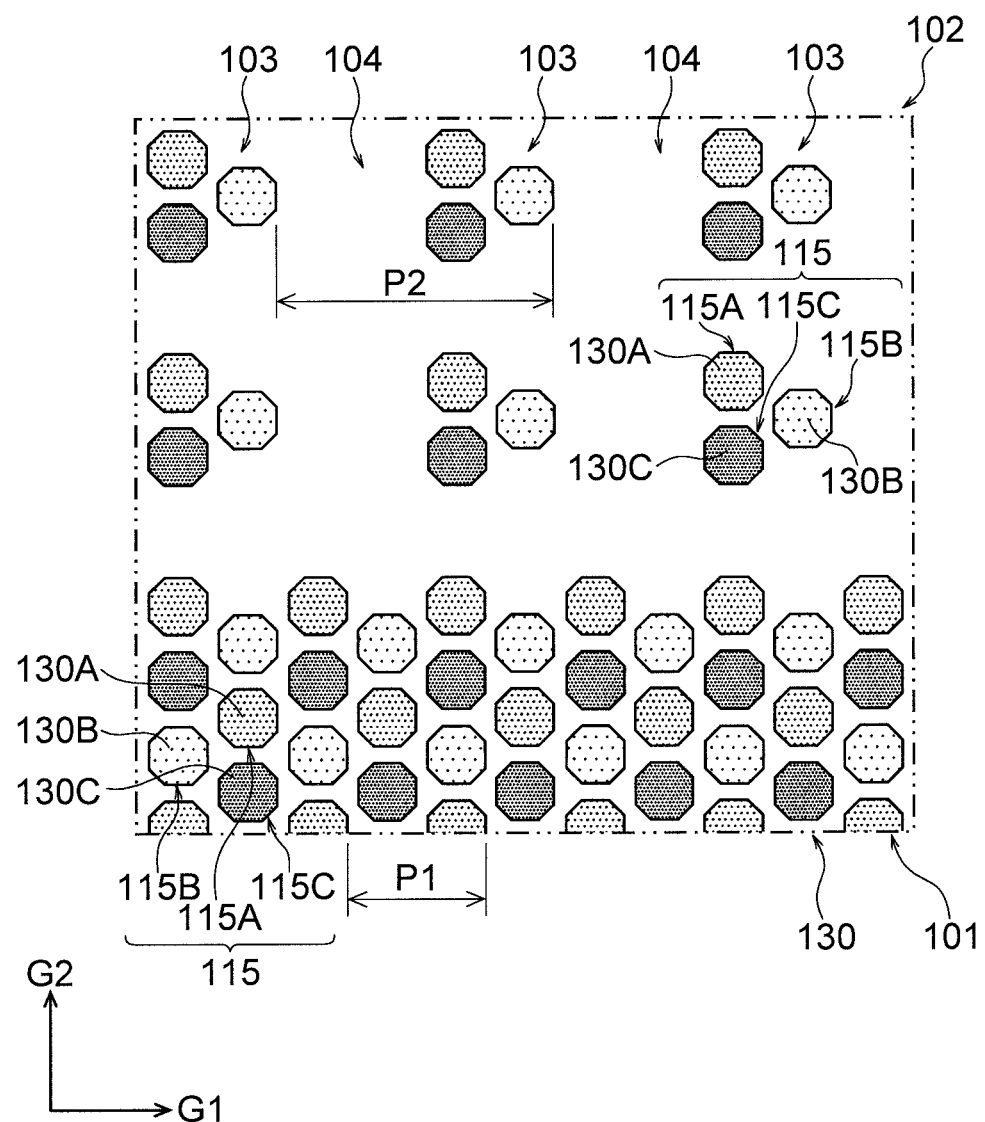
FIG. 4 is a plan view of the organic device illustrated in FIG. 3 with the second electrode removed therefrom.

FIG. 4 is a plan view of the organic device 100 illustrated in FIG. 3 with the second electrode 140 removed therefrom. The organic layer 130 may include the first organic layers 130A, the second organic layers 130B, and the third organic layers 130C. For example, the first organic layer 130A, the second organic layer 130B, and the third organic layer 130C are red light-emitting layer, blue light-emitting layer, and green light-emitting layer. In the following description, the words and reference characters of the "organic layer 130" are used in the case where an organic layer structure that is common to the first organic layer 130A, the second organic layer 130B, and the third organic layer 130C is described. The first organic layer 130A, the second organic layer 130B, and the third organic layer 130C are located on vertices of an equilateral triangle as in the three layers 140A to 140C of the second electrode 140.

The arrangement of the second electrode 140 and the organic layer 130 in a plan view is detected by observing the organic device 100 by using a digital microscope having high magnification. The occupancy ratios described above, an area, a dimension, a gap can be calculated based on the result of detection. In the case where the organic device 100 includes a cover such as a glass cover, the second electrode 140 and the organic layer 130 may be observed after the cover is removed. The cover may be removed by being peeled or broken. A scanning electron microscope may be used instead of the digital microscope.

Figure 5:
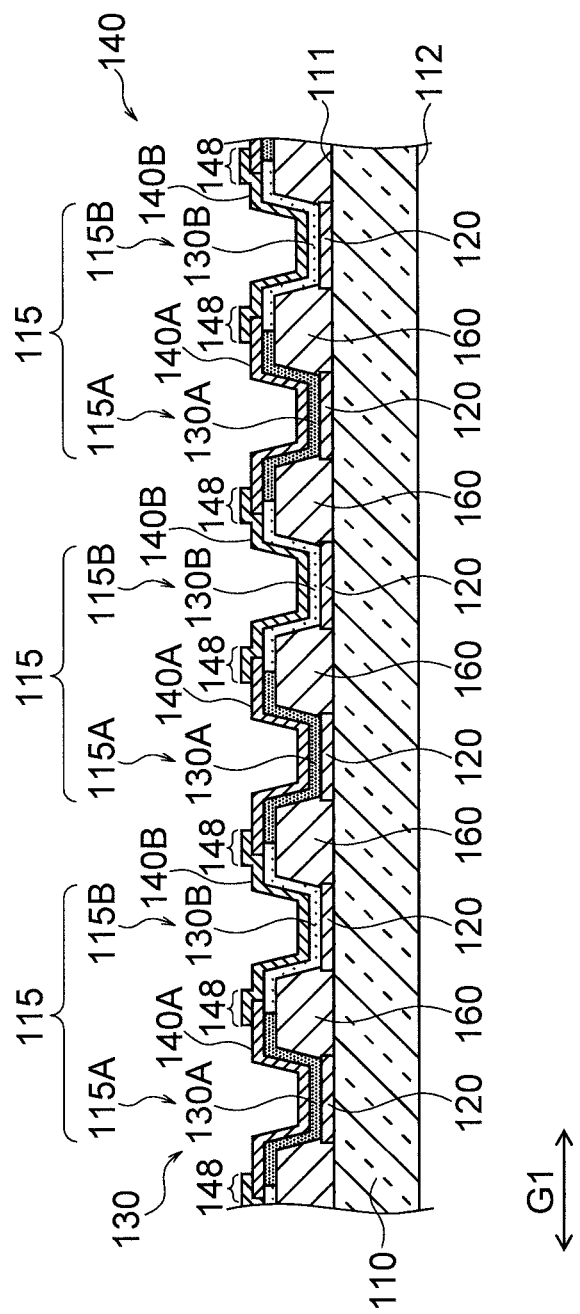
FIG. 5 is a sectional view of the organic device illustrated in FIG. 3 substantially taken along line A-A.
Figure 6:
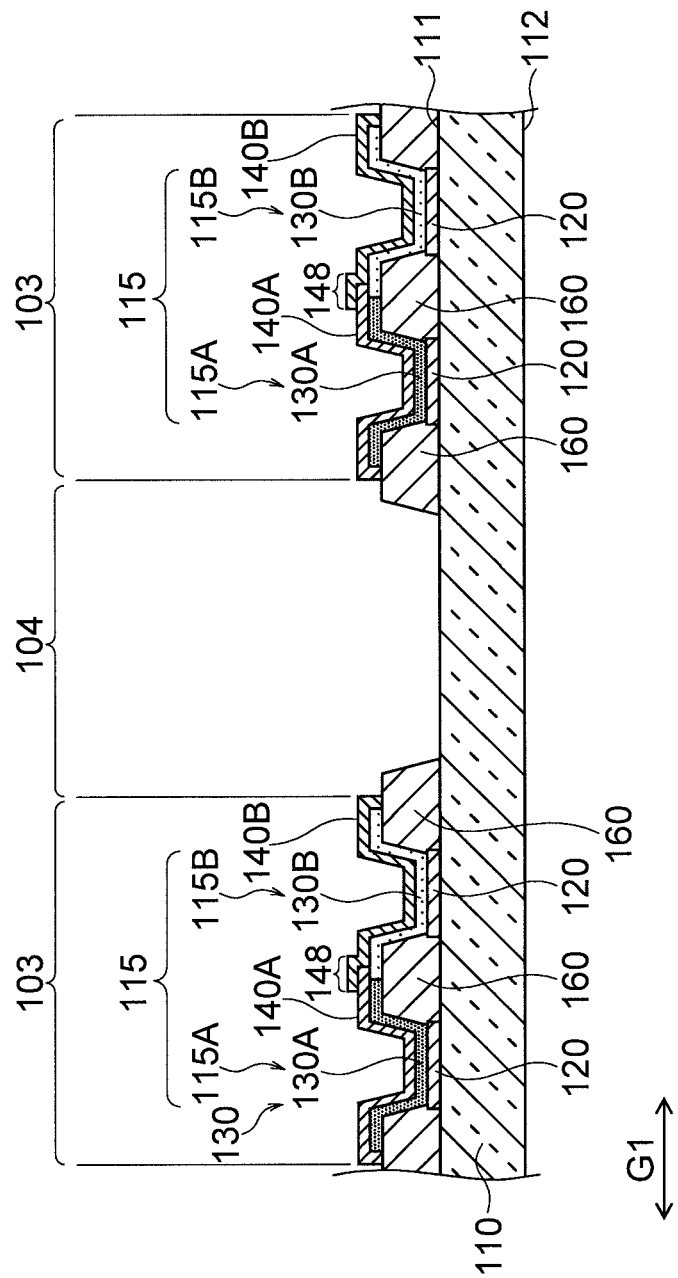
FIG. 6 is a sectional view of the organic device illustrated in FIG. 3 substantially taken along line B-B.

An example of the layered structure of the organic device 100 will now be described. FIG. 5 is a sectional view of the organic device illustrated in FIG. 3 substantially taken along line A-A. FIG. 6 is a sectional view of the organic device illustrated in FIG. 3 substantially taken along line B-B.

The organic device 100 includes the substrate 110 and the elements 115 that are located on the substrate 110 as described above. The element 115 may include the first electrode 120, the organic layer 130 that are located on the first electrode 120, and the second electrode 140 that are located on the organic layer 130 as described above.

The organic device 100 may include the insulating layers 160 each of which is located between two first electrodes 120 adjacent to each other in a plan view. The insulating layer 160 may contain, for example, polyimide. The insulating layer 160 may overlap end portions of the first electrode 120.

The insulating layer 160 may overlap electrode overlapping region 148 described later in a plan view. For example, the electrode overlapping region 148 may be surrounded by the contours of the insulating layer 160 in a plan view.

The electrode overlapping region 148 contain the multiple layers of the second electrode 140. For this reason, the electrode overlapping region 148 have a transmittance lower than that of a single layer of the second electrode 140. In some cases where light that passes through the electrode overlapping region 148 exits from the organic device 100, the intensity of the light is non-uniform. The insulating layer 160 that overlap the electrode overlapping region 148 inhibit the intensity of the light from being non-uniform.

In each electrode overlapping region 148, two layers partly overlap in a plan view. In the example illustrated in FIG. 3, the electrode overlapping region 148 includes a region in which the first layer 140A and the second layer 140B overlap, a region in which the first layer 140A and the third layer 140C overlap, and a region in which the second layer 140B and the third layer 140C overlap in a plan view. A region in which three layers 140A, 140B, and 140C overlap may not be included.

As illustrated in FIG. 7 and FIG. 8, the electrode overlapping region 148 may include first electrode overlapping region 149 in which the peripheral layer regions 142 of the layers overlap. FIG. 7 is a plan view of the electrode overlapping regions 148. FIG. 8 is a sectional view of the electrode overlapping regions 148.

For example, the first electrode overlapping region 149 include a region in which the peripheral layer region 142 of the first layer 140A and the peripheral layer region 142 of the second layer 140B overlap, a region in which the peripheral layer region 142 of the first layer 140A and the peripheral layer region 142 of the third layer 140C overlap, and a region in which the peripheral layer region 142 of the second layer 140B and the peripheral layer region 142 of the third layer 140C overlap. According to the present embodiment, the electrode overlapping region 148 include the first electrode overlapping region 149 in which the peripheral layer regions 142 of the layers overlap. In the electrode overlapping region, the main layer regions 141 of the layers may not overlap. The main layer regions 141 of the layers may not overlap.

Figure 9:
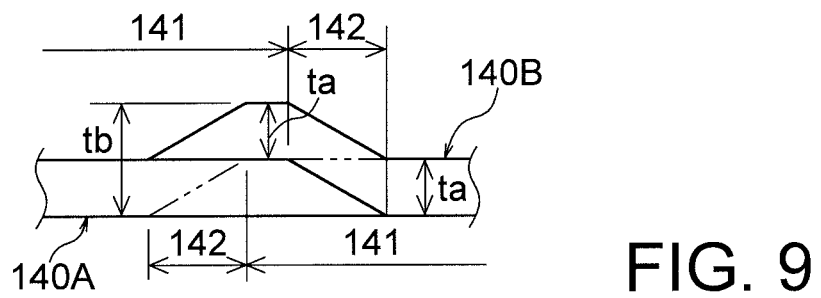
FIG. 9 is a sectional view of a comparative example of the electrode overlapping regions.

As illustrated in FIG. 8, the peripheral layer regions 142 overlap, and the thickness of the second electrode 140 in the electrode overlapping region 148 can be consequently decreased. For example, in the case where the main layer regions 141 overlap as illustrated in FIG. 9, the maximum thickness tb of the second electrode 140 in the electrode overlapping region 148 is twice the thickness to of the main layer region 141. In the case where the peripheral layer regions 142 overlap, however, the thickness tb of the second electrode 140 in the electrode overlapping region 148 is less than twice the thickness to of the main layer region 141. For this reason, the main layer regions 141 do not overlap, and the thickness tb of the second electrode 140 in the electrode overlapping region 148 can be decreased.

As illustrated in FIG. 8, the first electrode overlapping region 149 may be separated from the main layer region 141. Non-overlapping region 150 may be located between the first electrode overlapping region 149 and the main layer region 141.

For example, the first electrode overlapping region 149 in which the peripheral layer region 142 of the first layer 140A and the peripheral layer region 142 of the second layer 140B overlap may be separated from the main layer region 141 of the first layer 140A. The non-overlapping region 150 may be located between the first electrode overlapping region 149 and the main layer region 141 of the first layer 140A. The first electrode overlapping region 149 in which the peripheral layer region 142 of the first layer 140A and the peripheral layer region 142 of the second layer 140B overlap may be separated from the main layer region 141 of the second layer 140B. The non-overlapping region 150 may be located between the first electrode overlapping region 149 and the main layer region 141 of the second layer 140B.

Similarly, the first electrode overlapping region 149 in which the peripheral layer region 142 of the first layer 140A and the peripheral layer region 142 of the third layer 140C overlap may be separated from the main layer regions 141 of the layers 140A and 140C.

Similarly, the first electrode overlapping region 149 in which the peripheral layer region 142 of the second layer 140B and the peripheral layer region 142 of the third layer 140C overlap may be separated from the main layer regions 141 of the layers 140B and 140C.

The organic device 100 may be an active-matrix device. For example, the organic device 100 may include switches although this is not illustrated. The switches are electrically connected to the respective multiple elements 115. Examples of the switches may include transistors. The switches can control on-off of a voltage or current to the respective elements 115.

The substrate 110 has the first surface 111 and the second surface 112. The substrate 110 may be an insulating plate member. The substrate 110 preferably has transparency and allow light to pass therethrough.

In the case where the substrate 110 has predetermined optical transparency, the degree of the transparency of the substrate 110 may be such that light from the organic layers 130 can pass therethrough and can be displayed. For example, the transmittance of the substrate 110 in a visible-light region may be 70% or more or may be 80% or more. The transmittance of the substrate 110 may be measured by using a test method for Plastics-Determination of the total luminous transmittance of transparent materials based on JIS K7361-1.

The substrate 110 may be flexible or may not be flexible. The material of the substrate 110 may be appropriately selected depending on the use of the organic device 100.

Examples of the material of the substrate 110 may include inflexible rigid materials such as quartz glass, Pyrex (registered trademark) glass, a synthetic quartz plate, and non-alkali glass and flexible materials such as resin film, an optical resin plate, and thin glass. The substrate may have a multilayer body that includes a barrier layer on a surface of the resin film or barrier layers on surfaces of the resin film.

The thickness of the substrate 110 may be appropriately selected depending on, for example, the material used for the substrate 110 or the use of the organic device 100. For example, the thickness of the substrate 110 may be 0.005 mm or more. The thickness of the substrate 110 may be 5 mm or less.

The elements 115 may perform a function in a manner in which a voltage is applied between the first electrode 120 and the second electrode 140 or a current flows between the first electrode 120 and the second electrode 140. For example, in the case where the elements 115 are pixels of an organic electroluminescent display device, the elements 115 can emit light for forming a picture.

The first electrode 120 contain a conductive material. For example, the first electrode 120 may contain metal, a conductive metal oxide or another conductive inorganic material. The first electrode 120 may contain a conductive metal oxide that has transparency such as an indium tin oxide.

The material of the first electrodes 120 may be metal such as Au, Cr, Mo, Ag, or Mg, an indium tin oxide abbreviated as ITO, an indium zinc oxide abbreviated as IZO, a zinc oxide, an inorganic oxide such as indium oxide, or a conductive polymer such as polythiophene doped with metal. These conductive materials may be used alone, or two or more kinds of the materials may be combined and used. In the case where two or more kinds of the materials are used, layers composed of the respective materials may be stacked. An alloy containing two or more kinds of the materials may be used. For example, a magnesium alloy such as MgAg may be used.

The organic layer 130 contain an organic material. When the organic layer 130 are energized, the organic layer 130 can perform a function. The phrase "to be energized" means that a voltage is applied to the organic layer 130, or a current flows through the organic layer 130. Examples of the organic layer 130 may include light-emitting layers that emit light when being energized and layers the refractive index or the optical transmittance of which changes when being energized. The organic layer 130 may contain an organic semiconductor material.

Multilayer structure that includes the first electrode 120, the first organic layer 130A and the second electrode 140 are also referred to as first element 115A. Multilayer structure that includes the first electrode 120, the second organic layer 130B, and the second electrode 140 are also referred to as second element 115B. A multilayer structure that includes the first electrode 120, the third organic layer 130C, and the second electrode 140 is also referred to as third element 115C. In the case where the organic device 100 is an organic electroluminescent display device, the first element 115A, the second element 115B, and the third element 115C are sub-pixels. A single pixel may correspond to a combination of the first element 115A, the second element 115B, and the third element 115C.

In the following description, the words and reference characters of the "elements 115" are used in the case where an element structure that is common to the first element 115A, the second element 115B, and the third element 115C is described.

When a voltage is applied between the first electrode 120 and the second electrode 140, the organic layer 130 that are located therebetween are driven. In the case where the organic layer 130 are light-emitting layer, light is emitted from the organic layer 130, and the light exits from the second electrode 140 to the outside or the first electrode 120 to the outside.

In the case where the organic layer 130 includes light-emitting layer that emit light when being energized, the organic layer 130 may include a hole injection layer, a hole transport layer, an electron transport layer, an electron injection layer, and another layer.

For example, in the case where the first electrode 120 are anodes, the organic layer 130 may include hole injection transport layer between the light-emitting layer and the first electrode 120. The hole injection transport layer may be hole injection layer that have a hole injection function, may be hole transport layer that have a hole transport function, or may have both of the hole injection function and the hole transport function. The hole injection layer and the hole transport layer may be stacked on the hole injection transport layer.

In the case where the second electrode 140 is cathodes, the organic layer 130 may include electron injection transport layer between the light-emitting layer and the second electrode 140. The electron injection transport layer may be electron injection layer that have an electron injection function, may be electron transport layer that have an electron transport function, or may have both of the electron injection function and the electron transport function. The electron injection layer and the electron transport layer may be stacked on the electron injection transport layer.

The light-emitting layer contain a light-emitting material. The light-emitting layer may contain an additive that improves leveling properties.

A known material may be used as the light-emitting material. Examples of the light-emitting material include a pigment material, a metal complex material, and a polymeric material.

Examples of the pigment material may include a cyclopentadiene derivative, a tetraphenyl butadiene derivative, a triphenylamine derivative, an oxadiazole derivative, a pyrazoloquinoline derivative, a distyrylbenzene derivative, a distyrylarylene derivative, a silole derivative, a thiophene ring compound, a pyridine ring compound, a perinone derivative, a perylene derivative, an oligothiophene derivative, an oxadiazole dimer, and a pyrazoline dimer.

Examples of the metal complex material may include a metal complex that includes central metal such as Al, Zn, or Be, or rare-earth metal such as Tb, Eu, or Dy and a ligand such as an oxadiazole, thiadiazole, phenylpyridine, phenylbenzimidazole, or quinoline structure, such as an aluminum quinolinol complex, a benzoquinolinol beryllium complex, a benzoxazole zinc complex, a benzothiazole zinc complex, an azomethyl zinc complex, a porphyrin zinc complex, and a europium complex.

Examples of the polymeric material may include a poly (p-phenylene vinylene) derivative, a polythiophene derivative, a poly(p-phenylene) derivative, a polysilane derivative, a polyacetylene derivative, a polyvinylcarbazole derivative, a polyfluorene derivative, a polyquinoxaline derivative, and a copolymer thereof.

The light-emitting layers may contain a dopant in order to improve luminous efficacy or change a luminous wavelength. Examples of the dopant may include a perylene derivative, a coumarin derivative, a rubrene derivative, a quinacridone derivative, a squarylium derivative, a porphyrin derivative, a styryl pigment, a tetracene derivative, a pyrazoline derivative, decacyclene, phenoxazone, a quinoxaline derivative, a carbazole derivative, and a fluorene derivative. Heavy metal ions such as platinum or iridium ions may be contained as the dopant. An organic metal complex that has phosphorescence may be used. A single kind of a dopant may be used, or two or more kinds of dopants may be used.

For example, materials disclosed in [0126] to [0127] in JP 2010-272891 A or in [0128] to [0129] in WO 2012/132126 A may be used as the light-emitting material and the dopant.

The thickness of the light-emitting layer are not particularly limited provided that a luminous function can be performed by enabling an electron and a hole to be recombined.

For example, the thickness of the light-emitting layer may be 1 nm or more and 500 nm or less.

A hole injection transport material that is used for the hole injection transport layer may be a known material. Examples of the hole injection transport material may include a triazole derivative, an oxadiazole derivative, an imidazole derivative, a polyaryl alkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, a polythiophene derivative, a polyaniline derivative, a polypyrrole derivative, a phenylamine derivative, an anthracene derivative, a carbazole derivative, a fluorene derivative, a distyrylbenzene derivative, a polyphenylene vinylene derivative, a porphyrin derivative, and a styrylamine derivative. Other examples of the material can include a Spiro compound, a phthalocyanine compound, or a metal oxide. Compounds disclosed in Japanese Unexamined Patent Application Publication No. 2011-119681, International Publication No. 2012/018082, Japanese Unexamined Patent Application Publication No. 2012-069963, or [0132] in International Publication No. 2012/132126, for example, are appropriately selected and used as the hole injection transport material.

In the case where the hole injection transport layer have a structure in which a hole injection layer and a hole transport layer are stacked, the hole injection layer may contain an additive A, the hole transport layer may contain the additive A, or the hole injection layer and the hole transport layer may contain the additive A. The additive A may be a small molecule compound or a polymer compound. Examples of the additive A may include a fluorine compound, an ester compound, or a hydrocarbon compound.

An electron injection transport material that is used for the electron injection transport layer may be a known material. Examples of the electron injection transport material may include alkali metals, an alkali metal alloy, a halide of alkali metal, alkaline-earth metals, halides of alkaline-earth metals, an alkaline-earth metal oxide, an organic complex of alkali metal, a magnesium halide or oxide, and an aluminum oxide. Examples of the electron injection transport material may include bathocuproine, bathophenanthroline, a phenanthroline derivative, a triazole derivative, an oxadiazole derivative, a pyridine derivative, a nitro-substituted fluorene derivative, an anthraquinonedimethane derivative, a diphenylquinone derivative, a thiopyrandioxide derivative, aromacyclic tetracarboxylic anhydride such as naphthalene or perylene, carbodiimide, a fluorenylidenemethane derivative, an anthraquinonedimethane derivative, an anthrone derivative, a quinoxaline derivative, a metal complex such as a quinolinol complex, a phthalocyanine compound, and a distyrylpyrazine derivative.

Metal doped layer may be formed by doping an electron transport organic material with alkali metal or alkaline-earth metal and may be used as the electron injection transport layer. Examples of the electron transport organic material include metal complexes such as bathocuproine, bathophenanthroline, a phenanthroline derivative, a triazole derivative, an oxadiazole derivative, a pyridine derivative, and tris(8-quinolinolato) aluminum ($Alq_3$) and a polymer derivative thereof. Examples of the doped metal may include Li, Cs, Ba, and Sr.

The second electrode 140 contains a conductive material such as metal. The second electrode 140 may be formed on the organic layer 130 by using the deposition method in which the masks are used as described later. Examples of the material of the second electrode 140 may include platinum, gold, silver, copper, iron, tin, chromium, aluminum, indium, lithium, sodium, potassium, calcium, magnesium, chromium, or carbon. These materials may be used alone, or two or more kinds of the materials may be combined and used. In the case where two or more kinds of the materials are used, the second electrode 140 may have a structure in which layers composed of the respective materials are stacked. An alloy containing two or more kinds of the materials may be used for the second electrode 140. For example, a magnesium alloy such as MgAg, an aluminum alloy such as AlLi, AlCs, or AlMg, an alkali metal alloy, or an alkaline-earth metal alloy may be used for the second electrode 140.

For example, the thickness ta of the main layer region 141 of the second electrode 140 may be 5 nm or more, may be 10 nm or more, may be 50 nm or more, or may be 100 nm or more. For example, the thickness ta of the main layer region 141 may be 200 nm or less, may be 500 nm or less, may be 1 μm or less, or may be 100 μm or less. The range of the thickness ta of the main layer region 141 may be determined by using a first group consisting of 5 nm, 10 nm, 50 nm, and 100 nm and/or a second group consisting of 200 nm, 500 nm, 1 μm and 100 μm. The range of the thickness ta of the main layer region 141 may be determined by using a combination of a value freely selected from the values in the first group described above and a value freely selected from the values in the second group described above. The range of the thickness ta of the main layer region 141 may be determined by using a combination of two values freely selected from the values in the first group described above. The range of the thickness ta of the main layer region 141 may be determined by using a combination of two values freely selected from the values in the second group described above. For example, the range may be 5 nm or more and 100 μm or less, may be 5 nm or more and 1 μm or less, may be 5 nm or more and 500 nm or less, may be 5 nm or more and 200 nm or less, may be 5 nm or more and 100 nm or less, may be 5 nm or more and 50 nm or less, may be 5 nm or more and 10 nm or less, may be 10 nm or more and 100 μm or less, may be 10 nm or more and 1 μm or less, may be 10 nm or more and 500 nm or less, may be 10 nm or more and 200 nm or less, may be 10 nm or more and 100 nm or less, may be 10 nm or more and 50 nm or less, may be 50 nm or more and 100 μm or less, may be 50 nm or more and 1 μm or less, may be 50 nm or more and 500 nm or less, may be 50 nm or more and 200 nm or less, may be 50 nm or more and 100 nm or less, may be 100 nm or more and 100 μm or less, may be 100 nm or more and 1 μm or less, may be 100 nm or more and 500 nm or less, may be 100 nm or more and 200 nm or less, may be 200 nm or more and 100 μm or less, may be 200 nm or more and 1 μm or less, may be 200 nm or more and 500 nm or less, may be 500 nm or more and 100 μm or less, may be 500 nm or more and 1 μm or less, or may be 1 μm or more and 100 μm or less.

As the thickness to of the main layer region 141 decrease, the transmittance of the second electrode 140 increases, and the transmittance of the non-transparent region 103 increases. Light that enters the non-transparent region 103 can reach the sensor depending on the transmittance of the non-transparent region 103. The amount of light that is received by the sensor can be increased by increasing the transmittance of the non-transparent region 103.

The thickness of each component of the organic device 100 may be measured by observing an image of a section of the organic device 100 by using a scanning electron microscope or a white light interferometer. For example, the thickness of the substrate 110 and the thickness of the second electrode 140 may be measured by using a scanning electron microscope or a white light interferometer. For example, the thickness of the main layer region 141 of the second electrode 140 may be measured by using a white light interferometer "VertScan (registered trademark), R6500H-A300" manufactured by Mitsubishi Chemical Systems, Inc.

Figure 10:
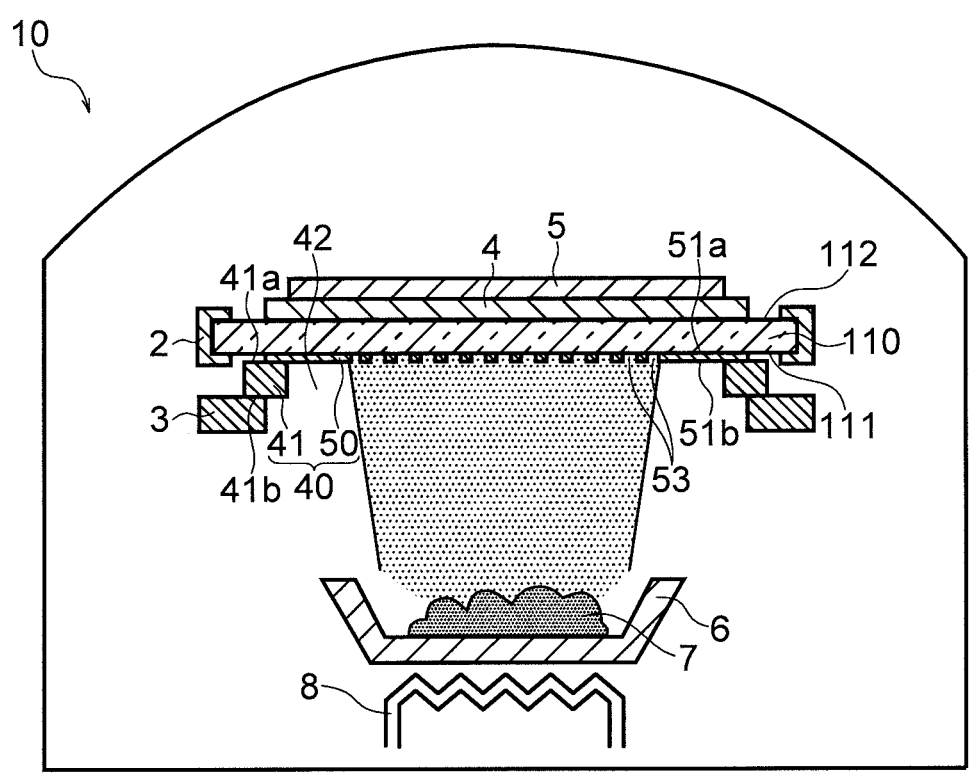
FIG. 10 illustrates an example of a deposition apparatus that includes a mask apparatus.

A method of forming the second electrode 140 of the organic device 100 described above by using the deposition method will be described. FIG. 10 illustrates a deposition apparatus 10. The deposition apparatus 10 performs a deposition process for depositing a deposition material on a subject.

The deposition apparatus 10 may contain a deposition source 6, a heater 8, and a mask apparatus 40. The deposition apparatus 10 may include an exhaust unit for obtaining a vacuum atmosphere in the deposition apparatus 10. An example of the deposition source 6 is a crucible. The deposition source 6 contains a deposition material 7 such as a conductive material. The heater 8 heats the deposition source 6 and vaporizes the deposition material 7 under the vacuum atmosphere. The mask apparatus 40 faces the crucible 6.

As illustrated in FIG. 10, the mask apparatus 40 may include at least a single mask 50 and a frame 41 that supports the mask 50. The frame 41 may have a first frame surface 41a and a second frame surface 41b. The mask 50 may be fixed to the first frame surface 41a. The second frame surface 41b is located opposite the first frame surface 41a. The frame 41 may have an opening 42. The opening 42 extends through the frame 41 from the first frame surface 41a to the second frame surface 41b. The mask 50 may be fixed to the frame 41 so as to be across the opening 42 in a plan view. The frame 41 may support the mask 50 with the mask 50 pulled in the direction of a surface thereof. This inhibits the mask 50 from being bent.

As for the mask 50, the first mask 50A, the second mask 50B or the third mask 50C described later may be used. In the following description, the words and reference characters of the "mask 50" are used in the case where a mask structure that is common to the first mask 50A, the second mask 50B, and the third mask 50C is described. In this case, reference characters that contain no alphabet and that contain only numerals such as numerals "53" or "54" are used as in the parts of the mask such as the through-holes and a shield region described later. In some cases where contents that are peculiar to the first mask 50A, the second mask 50B, and the third mask 50C are described, reference characters that contain a suitable alphabet such as "A", "B", or "C" behind a numeral are used.

The mask 50 of the mask apparatus 40 faces the first surface 111 of the substrate 110. The deposition material 7 is attached to the substrate 110 by using the mask 50. The mask 50 has the multiple through-holes 53. The through-holes 53 allow the deposition material 7 that comes from the deposition source 6 to pass therethrough. The deposition material 7 that passes through the through-holes 53 is attached to the first surface 111 of the substrate 110. The mask 50 may have a first surface 51a and a second surface 51b. The first surface 51a faces the first surface 111. The second surface 51b is located opposite the first surface 51a. The through-holes 53 extend through the mask 50 from the first surface 51a to the second surface 51b.

The deposition apparatus 10 may include a substrate holder 2 that holds the substrate 110. The substrate holder 2 may be movable in the thickness direction of the substrate 110. The substrate holder 2 may be movable in a direction in which the first surface 111 of the substrate 110 extends. The substrate holder 2 may control the inclination of the substrate 110. For example, the substrate holder 2 may include multiple chucks that are mounted on outer edges of the substrate 110. The chucks may be separately movable in the thickness direction of the substrate 110 and in the direction in which the first surface 111 extends.

The deposition apparatus 10 may include a mask holder 3 that holds the mask apparatus 40. The mask holder 3 may be movable in the thickness direction of the mask 50. The mask holder 3 may be movable in a direction in which the first surface 51a of the mask 50 extends. For example, the mask holder 3 may include multiple chucks that are mounted on outer edges of the frame 41. The chucks may be separately movable in the thickness direction of the mask 50 and in the direction in which the first surface 51a extends.

The position of the mask 50 of the mask apparatus 40 with respect to the substrate 110 can be adjusted by moving at least the substrate holder 2 or the mask holder 3.

The deposition apparatus 10 may include a cooling plate 4. The cooling plate 4 may face the second surface 112 of the substrate 110. The cooling plate 4 may contain a flow path through which refrigerant circulates in the cooling plate 4. The cooling plate 4 can inhibit the temperature of the substrate 110 from increasing in a deposition process.

The deposition apparatus 10 may include a magnet 5 facing the second surface 112. The magnet 5 may be stacked on the cooling plate 4. The magnet 5 attracts the mask 50 toward the substrate 110 due to magnetic force. This enables a gap between the mask 50 and the substrate 110 to be reduced or eliminated. Consequently, shadow is inhibited from occurring in the deposition process. For this reason, precision of the dimensions of the second electrode 140 and the precision of the positions thereof can be improved. Alternatively, the mask 50 may be attracted toward the substrate 110 by using an electrostatic chuck that uses electrostatic force instead of the magnet 5.

Figure 11:
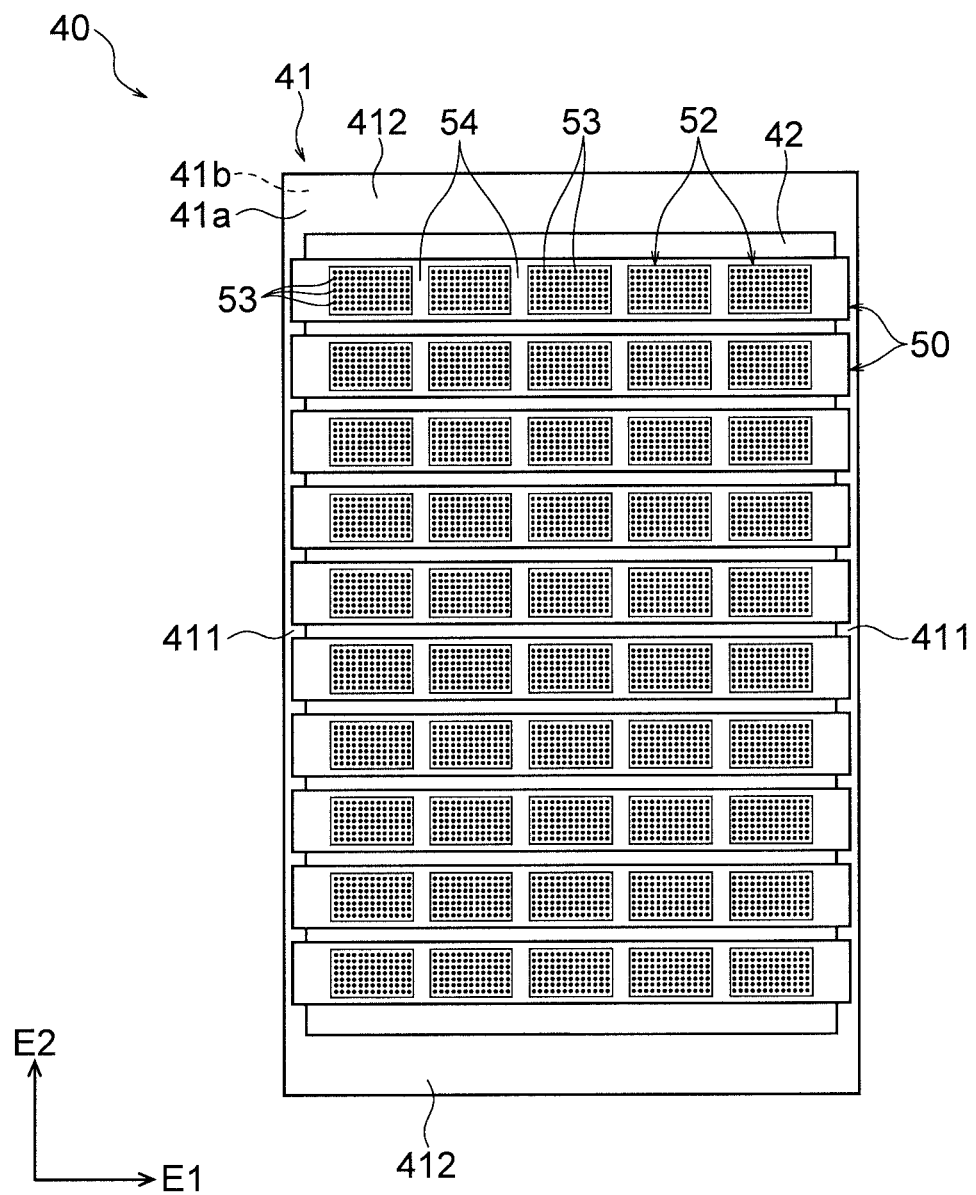
FIG. 11 is a plan view of an example of the mask apparatus.

The mask apparatus 40 will be described. FIG. 11 is a plan view of the mask apparatus 40. The mask apparatus 40 may include two or more masks 50. The masks 50 may be fixed to the frame 41 by, for example, welding.

The frame 41 has a pair of first sides 411 and a pair of second sides 412. The frame 41 may have a rectangular contour. The masks 50 to which a tensile force is applied may be fixed to the first sides 411. The first sides 411 may be longer than the second sides 412. The pair of first sides 411 and the pair of the second sides 412 may surround the opening 42.

The material of the frame 41 may be the same as the material of the masks 50 described later. An example of the material of the frame 41 may be an iron alloy containing nickel.

Each mask 50 includes at least a cell 52. The cell 52 includes the through-holes 53 and has a shield region 54 that is located around the through-holes 53. The cell 52 includes the multiple through-holes 53. The mask 50 may include two or more cells 52. In the case where a display device such as an organic electroluminescent display device is manufactured by using the mask 50, the single cell 52 may correspond to a single display region of the organic electroluminescent display device, that is, a single screen. The single cell 52 may correspond to multiple display regions. The shield region 54 may be located between two cells 52. The mask 50 may include the through-holes that are located between the two cells 52 although this is not illustrated.

For example, the cell 52 may have a substantially quadrilateral shape in a plan view, more precisely, a substantially rectangular contour in a plan view. The cell 52 may have a contour that has a different shape depending on the shape of the display region of the organic electroluminescent display device. For example, the cell 52 may have a circular contour.

Figure 12:
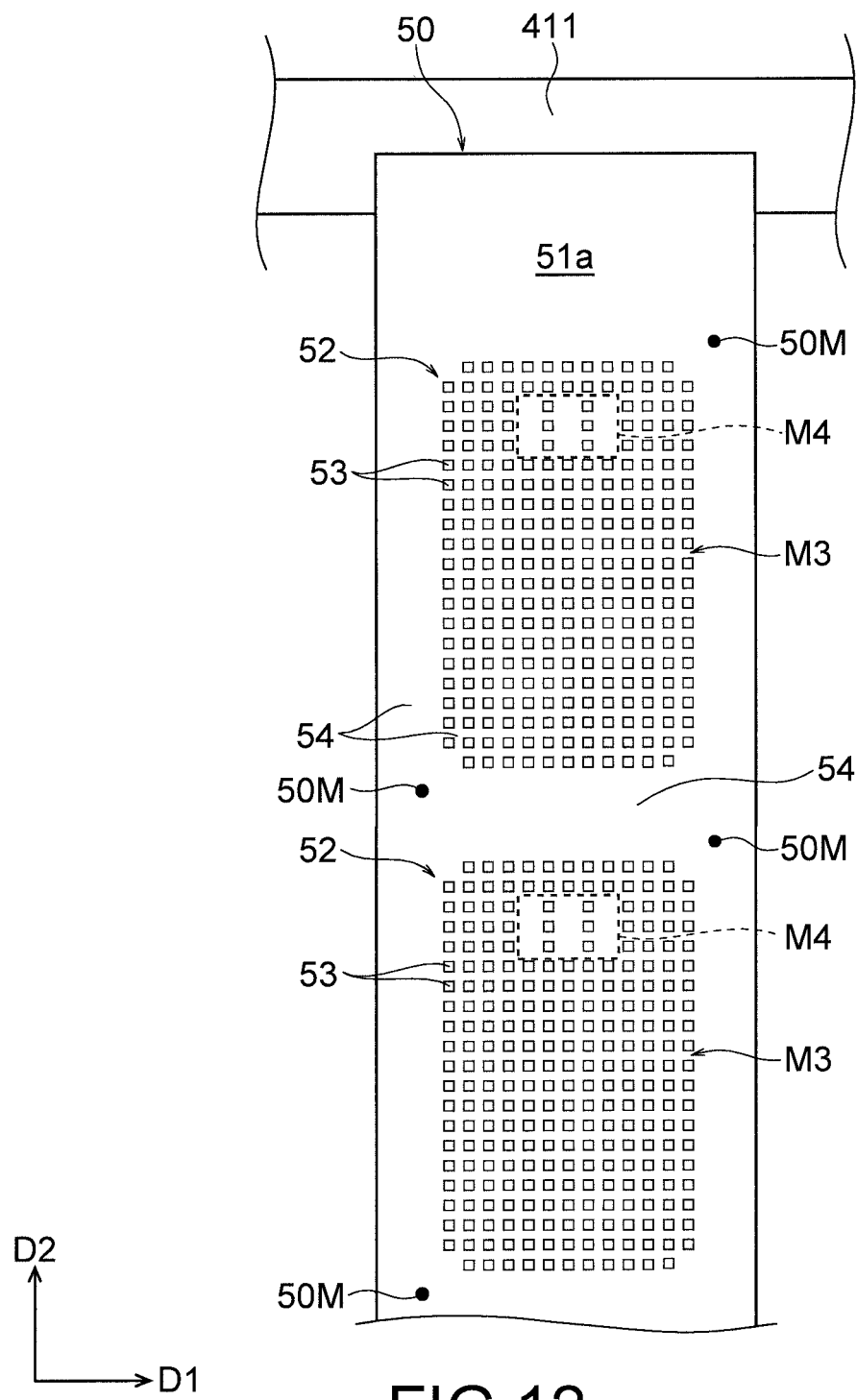
FIG. 12 is a plan view of a mask of the mask apparatus.

FIG. 12 is an enlarged plan view of an example of the mask 50. The mask 50 has a first mask direction D1 and a second mask direction D2 that intersects the first mask direction D1. The first mask direction D1 may be perpendicular to the second mask direction D2. The first mask direction D1 may coincide with the first element direction G1. The second mask direction D2 may coincide with the second element direction G2.

The mask 50 includes the through-holes 53 and the shield region 54 described above. The through-holes 53 are arranged in the first mask direction D1 and in the second mask direction D2.

In the case where the mask 50 is viewed in the normal direction of the first surface 51a, the mask 50 has a third mask region M3 and a fourth mask region M4. The third mask region M3 corresponds to the first display region 101 of the organic device 100 and overlaps a first mask region M1 of a mask multilayer body 55 described later. The fourth mask region M4 corresponds to the second display region 102 of the organic device 100 and overlaps a second mask region M2 of the mask multilayer body 55 described later.

In the third mask region M3, the multiple through-holes 53 may be located. In other words, in the first mask region M1 that overlaps the third mask region M3, the multiple through-holes 53 of the mask 50 may be located. The multiple through-holes 53 in the third mask region M3 may be patterned. For example, the multiple through-holes 53 may be associated with any one of the first layers 140A to the third layers 140C of the second electrode 140 in the first display region 101.

The third mask region M3 has a third aperture ratio that represents the area ratio of the through-holes 53. The third aperture ratio is calculated by dividing the sum of the areas of the through-holes 53 that are located in the third mask region M3 by the area of the third mask region M3. The areas of the through-holes 53 used to calculate the third aperture ratio may be the areas of the through-holes 53 on the first surface 51a or the planer area of through-portions 534 described later. The third aperture ratio may be higher than 0% and lower than 100%. In this case, the third mask region M3 includes a region that is occupied by the through-holes 53 and a region that is not occupied by the through-holes 53.

In the fourth mask region M4, the multiple through-holes 53 may be located. In other words, in the second mask region M2 that overlaps the fourth mask region M4, the multiple through-holes 53 of the mask 50 may be located. The multiple through-holes 53 in the fourth mask region M4 may be patterned. For example, the multiple through-holes 53 may be associated with any one of the first layers 140A to the third layers 140C of the second electrode 140 in the second display region 102.

The fourth mask region M4 has a fourth aperture ratio that represents the area ratio of the through-holes 53. The fourth aperture ratio is calculated by dividing the sum of the areas of the through-holes 53 that are located in the fourth mask region M4 by the area of the fourth mask region M4. The fourth aperture ratio may be lower than the third aperture ratio. The areas of the through-holes 53 used to calculate the fourth aperture ratio may be the areas of the through-holes 53 on the first surface 51a or the planer area of the through-portions 534 described later. The fourth aperture ratio may be higher than 0% and lower than 100%. In this case, the fourth mask region M4 includes a region that is occupied by the through-holes 53 and a region that is not occupied by the through-holes 53.

For example, the ratio of the fourth aperture ratio to the third aperture ratio may be 0.2 or more, may be 0.3 or more, or may be 0.4 or more. For example, the ratio of the fourth aperture ratio to the third aperture ratio may be 0.6 or less, may be 0.7 or less, or may be 0.8 or less. The range of the ratio of the fourth aperture ratio to the third aperture ratio may be determined by using the first group consisting of 0.2, 0.3, and 0.4 and/or the second group consisting of 0.6, 0.7, and 0.8. The range of the ratio of the fourth aperture ratio to the third aperture ratio may be determined by using a combination of a value freely selected from the values in the first group described above and a value freely selected from the values in the second group described above. The range of the ratio of the fourth aperture ratio to the third aperture ratio may be determined by using a combination of two values freely selected from the values in the first group described above. The range of the ratio of the fourth aperture ratio to the third aperture ratio may be determined by using a combination of two values freely selected from the values in the second group described above. For example, the range may be 0.2 or more and 0.8 or less, may be 0.2 or more and 0.7 or less, may be 0.2 or more and 0.6 or less, may be 0.2 or more and 0.4 or less, may be 0.2 or more and 0.3 or less, may be 0.3 or more and 0.8 or less, may be 0.3 or more and 0.7 or less, may be 0.3 or more and 0.6 or less, may be 0.3 or more and 0.4 or less, may be 0.4 or more and 0.8 or less, may be 0.4 or more and 0.7 or less, may be 0.4 or more and 0.6 or less, may be 0.6 or more and 0.8 or less, may be 0.6 or more and 0.7 or less, or may be 0.7 or more and 0.8 or less.

The mask 50 may have an alignment mark 50M. For example, the alignment mark 50M is formed at a corner of the cell 52 of the mask 50. The alignment mark 50M may be used for adjusting the position of the mask 50 with respect to the substrate 110 in a process of forming the second electrode 140 on the substrate 110 in the deposition method in which the mask 50 is used. For example, the alignment mark 50M may be formed at a position at which the alignment mark 50M overlaps the opening 42 or may be formed at a position at which the alignment mark 50M overlaps the frame 41. When the mask apparatus 40 is manufactured, the alignment mark 50M may be used for adjusting the positions of the mask 50 and the frame 41.

Figure 13A:
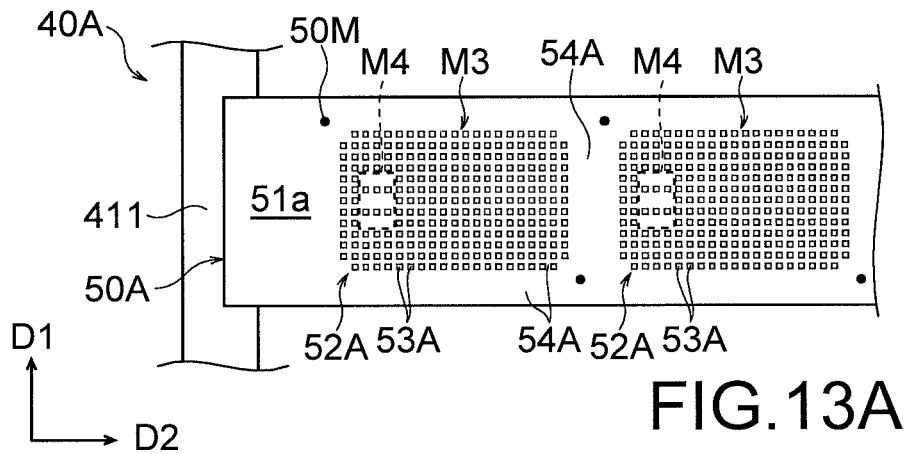
FIG. 13A is a plan view of a first mask apparatus.
Figure 13B:
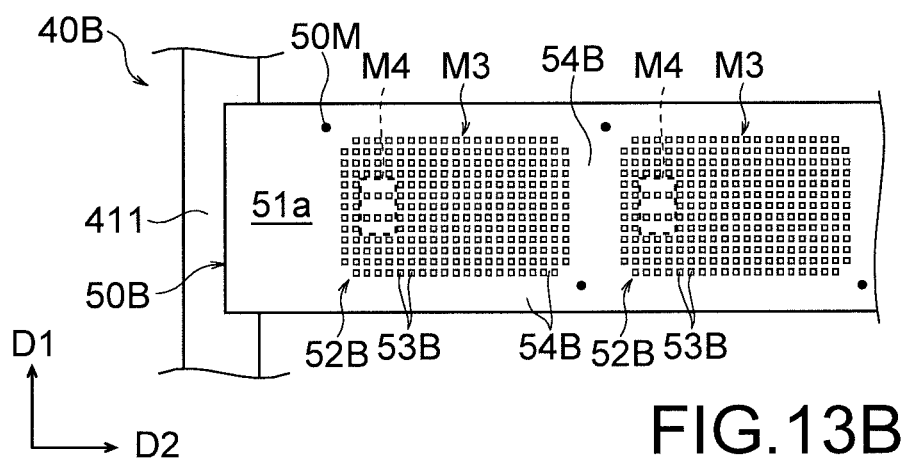
FIG. 13B is a plan view of a second mask apparatus.
Figure 13C:
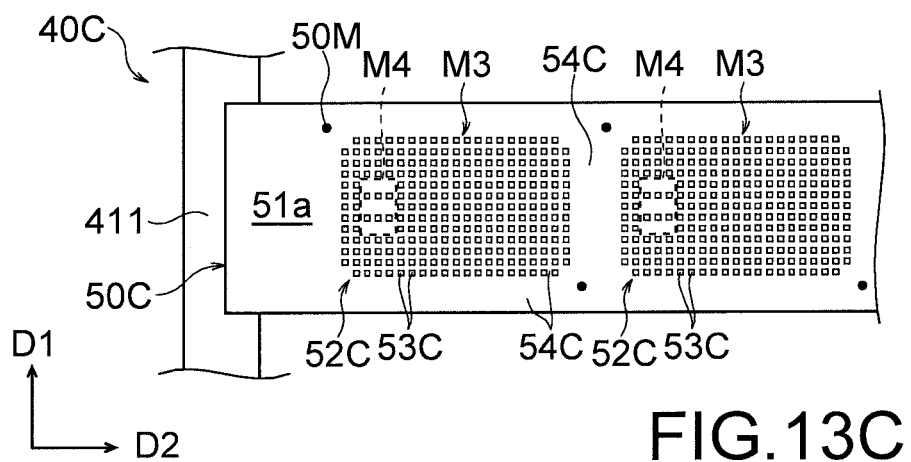
FIG. 13C illustrates a third mask apparatus.

In the process of forming the second electrode 140, multiple masks 50 may be used. For example, as illustrated in FIG. 13A to FIG. 13C, the multiple masks 50 may include the first mask 50A, the second mask 50B, and the third mask 50C. The first mask 50A, the second mask 50B, and the third mask 50C may be included in different mask apparatuses 40. As illustrated in FIG. 13A, the mask apparatus 40 that includes the first mask 50A is also referred to as a first mask apparatus 40A. As illustrated in FIG. 13B, the mask apparatus 40 that includes the second mask 50B is also referred to as a second mask apparatus 40B. As illustrated in FIG. 13C, the mask apparatus 40 that includes the third mask 50C is also referred to as a third mask apparatus 40C.

In the process of forming the second electrode 140, for example, the first mask apparatus 40A illustrated in FIG. 13A is mounted on the deposition apparatus 10, and the first layers 140A of the second electrode 140 are formed on the substrate 110. Subsequently, the second mask apparatus 40B illustrated in FIG. 13B is mounted on the deposition apparatus 10, and the second layers 140B of the second electrode 140 are formed on the substrate 110. Subsequently, the third mask apparatus 40C illustrated in FIG. 13C is mounted on the deposition apparatus 10, and the third layers 140C of the second electrode 140 are formed on the substrate 110. In this way, in the process of forming the second electrode 140 of the organic device 100, the multiple masks 50 such as the first mask 50A, the second mask 50B, and the third mask 50C are used in turn. A group of the multiple masks 50 that are used to form the second electrode 140 of the organic device 100 is also referred to as a "mask group".

Figure 14:
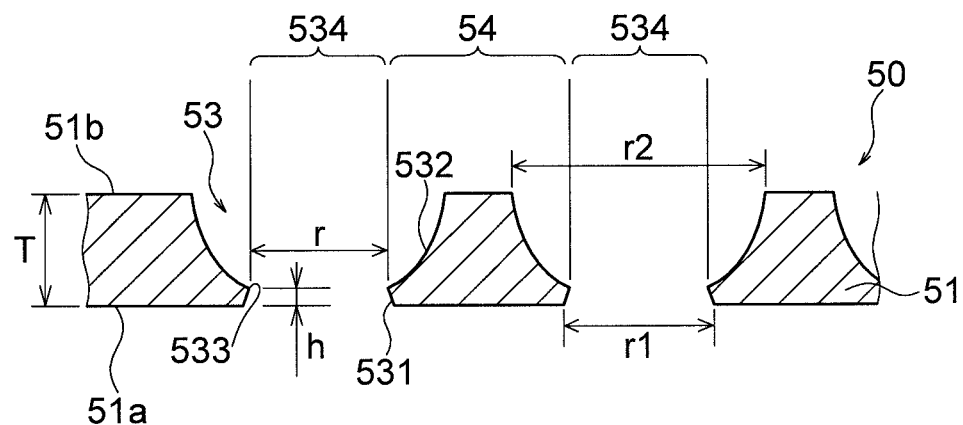
FIG. 14 is a sectional view of an example of a mask sectional structure.

FIG. 14 illustrates an example of a sectional structure of the mask 50. The mask 50 includes a metal plate 51 in which the multiple through-holes 53 are formed. The through-holes 53 extend through the metal plate 51 from the first surface 51a to the second surface 51b.

The through-holes 53 may include first recessed portions 531 and second recessed portions 532. The first recessed portions 531 are located at the first surface 51a. The second recessed portions 532 are located at the second surface 51b. The first recessed portion 531 is connected to the second recessed portion 532 in the thickness direction of the metal plate 51.

Dimension r2 of the second recessed portion 532 may be larger than dimension r1 of the first recessed portion 531 in a plan view. The first recessed portion 531 may be formed by, for example, etching the metal plate 51 from the first surface 51a. The second recessed portion 532 may be formed by, for example, etching the metal plate 51 from the second surface 51b. The first recessed portion 531 and the second recessed portion 532 are connected to each other at connection portion 533. The heights h of the connection portion 533 from the first surface 51a are also referred to as sectional heights. The sectional heights can affect the shadow described later.

Reference characters 534 represent the through-portion. The areas of the openings of the through-hole 53 in a plan view are smallest at the through-portion 534. The through-portion 534 may be defined by the connection portion 533. In FIG. 14, the through-portion 534 is illustrated by using a dimension r. The dimension r is smaller than the dimension r1 and smaller than the dimension r2.

In the deposition method in which the mask 50 is used, the deposition material 7 passes through the through-portions 534 in the through-holes 53 from the second surface 51b to the first surface 51a. The deposition material 7 that passes therethrough is attached to the substrate 110, and the second electrode 140 described above are consequently formed on the substrate 110. More specifically, the layers such as the first layers 140A, the second layers 140B, and the third layers 140C described above are formed on the substrate 110. The planar contour of the layer that are formed on the substrate 110 are mainly defined by the planar contour of the through-portion 534. More specifically, the main layer region 141 of the second electrode 140 are mainly defined by the planar contour of the through-portion 534. The peripheral layer region 142 of the second electrode 140 are mainly defined by the contours of through-holes 53A to 53C on the first surface 51a.

In the deposition process for depositing the deposition material 7 on the substrate 110, a part of the deposition material 7 comes in the normal direction of the substrate 110 from the deposition source 6 toward the substrate 110. However, a part of the deposition material 7 can come in a direction that inclines with respect to the normal direction.

In this case, the part of the deposition material 7 that comes in the inclining direction does not reach the substrate 110 but reaches and attaches to the wall surface of the through-hole 53 and the second surface 51b of the mask 50. As for the through-hole 53, the part is likely to be attached to the wall surface of the second recessed portion 532. For this reason, the thickness of a deposition layer that is formed on the substrate 110 is likely to decrease as the position thereof is nearer to the wall surface of the through-hole 53 although a desired thickness can be maintained at the centers of the through-holes 53. Such a phenomenon in which attachment of the deposition material 7 to the substrate 110 is impeded by the wall surface of the through-hole 53 and the second surface 51b is referred to as the shadow.

The through-hole 53 has the effective region 57 and the peripheral region 58. The effective region 57 is located at the center of the through-hole 53 in a plan view and is unlikely to be affected by the shadow described above. The peripheral region 58 are located outside the effective region 57 and around the effective region 57. The peripheral region 58 is likely to be affected by the shadow. The effective region 57 and the peripheral region 58 are located on the first surface 51a.

The effective region 57 and the peripheral region 58 may be defined by region-defining straight line L that pass through the connection portion 533 described above. The region-defining straight line L may be defined as a straight line that pass through the connection portion 533 and that form angle θ together with the first surface 51a of the mask 50. The effective region 57 is defined as a region inside the first intersection point CP1 at which the region-defining straight line L intersects the first surface 51a in the through-holes 53. The peripheral region 58 is defined as a region outside the first intersection point CP1 in the through-hole 53.

The region-defining straight line L may be defined by using a direction in which the deposition material 7 comes or sectional shape of the through-hole 53. In an example illustrated in FIG. 15, the region-defining straight line L is defined by the sectional shape of the through-hole 53.

Figure 15:
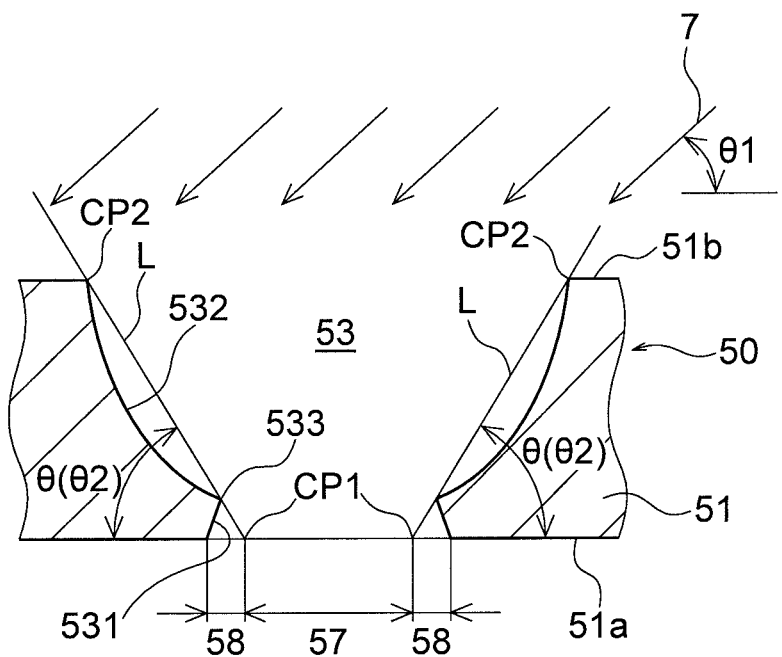
FIG. 15 is a sectional view of an effective region and a peripheral region of a through-hole.

More specifically, as illustrated in FIG. 15, an angle that is formed between the direction in which the deposition material 7 comes from the deposition source 6 and the first surface 51a of the mask 50 is a coming angle θ1. Angle that is formed between a straight line that passes through the connection portions 533 and that is in contact with freely selected point on the wall surface of the second recessed portion 532 and the first surface 51a of the mask 50 are mask angle θ2. In the example illustrated in FIG. 15, the mask angle θ2 is larger than the coming angle θ1. In this case, the peripheral region 58 that is likely to be affected by the shadow depend on the mask angle θ2. For this reason, the angle θ of the region-defining straight line L may be equal to the mask angle θ2. In this case, the region-defining straight line L passes through the connection portion 533 and is in contact with the freely selected point on the wall surface of the second recessed portion 532. In the example illustrated in FIG. 15, the region-defining straight line L passes through second intersection point CP2 between the second recessed portion 532 and the second surface 52b. In the example illustrated in FIG. 15, the width of the peripheral region 58 is expressed as a sectional height h/tan θ2.

For example, the angle θ2 that is formed between the region-defining straight line L illustrated in FIG. 15 and the first surface 51a may be 35° or more, may be 40° or more, or may be 45° or more. For example, the angle θ2 may be 50° or less, may be 60° or less, or may be 70° or less. The range of the angle θ2 may be determined by using a first group consisting of 35°, 40°, and 45° and/or a second group consisting of 50°, 60°, and 70°. The range of the angle θ2 may be determined by using a combination of a value freely selected from the values in the first group described above and a value freely selected from the values in the second group described above. The range of the angle θ2 may be determined by using a combination of two values freely selected from the values in the first group described above. The range of the angle θ2 may be determined by using a combination of two values freely selected from the values in the second group described above. For example, the range may be 35° or more and 70° or less, may be 35° or more and 60° or less, may be 35° or more and 50° or less, may be 35° or more and 45° or less, may be 35° or more and 40° or less, may be 40° or more and 70° or less, may be 40° or more and 60° or less, may be 40° or more and 50° or less, may be 40° or more and 45° or less, may be 45° or more and 70° or less, may be 45° or more and 60° or less, may be 45° or more and 50° or less, may be 50° or more and 70° or less, may be 50° or more and 60° or less, or may be 60° or more and 70° or less.

The through-holes 53 may have a contour that has a substantially polygonal shape in a plan view or a contour that has a substantially circular shape. For example, the through-holes 53 may have a contour that has a substantially quadrilateral shape, a substantially hexagonal shape, or a substantially octagonal shape.

The shapes of the through-holes 53 may be similar to each other in the thickness direction of the mask 50. In examples illustrated in FIG. 16 to FIG. 19, the through-holes 53 have a contour that has a substantially regular octagonal shape. Two sides that face each other extend in the first mask direction D1. Other two sides that face each other extend in the second mask direction D2. In the case where the through-holes 53 have a contour that has a substantially polygonal shape, four corners of the contour may be curved.

A region of the metal plate 51 other than the through-portions 534 corresponds to the shield region 54 that can shield the deposition material 7 that moves toward the substrate 110 and that is described above.

The shield region 54 in the fourth mask region M4 may contain a recessed portion that does not extend through the metal plate 51. The recessed portion that is contained in the fourth mask region M4 enables the rigidity of the fourth mask region M4 to be decreased. This enables a difference between the rigidity of the fourth mask region M4 and the rigidity of the third mask region M3 to be decreased. This inhibits the mask 50 from having a wrinkle due to the difference in rigidity. For example, the wrinkle is likely to occur when a tensile force is applied to the mask 50.

For example, the thickness T of the mask 50 may be 5 μm or more, may be 10 μm or more, may be 15 μm or more, or may be 20 μm or more. For example, the thickness T of the mask 50 may be 25 μm or less, may be 30 μm or less, may be 50 μm or less, or may be 100 μm or less. The range of the thickness T of the mask 50 may be determined by using a first group consisting of 5 μm, 10 μm, 15 μm, and 20 μm and/or a second group consisting of 25 μm, 30 μm, 50 μm, and 100 μm. The range of the thickness T of the mask 50 may be determined by using a combination of a value freely selected from the values in the first group described above and a value freely selected from the values in the second group described above. The range of the thickness T of the mask 50 may be determined by using a combination of two values freely selected from the values in the first group described above. The range of the thickness T of the mask 50 may be determined by using a combination of two values freely selected from the values in the second group described above. For example, the range may be 5 μm or more and 100 μm or less, may be 5 μm or more and 50 μm or less, may be 5 μm or more and 30 μm or less, may be 5 μm or more and 25 μm or less, may be 5 μm or more and 20 μm or less, may be 5 μm or more and 15 μm or less, may be 5 μm or more and 10 μm or less, may be 10 μm or more and 100 μm or less, may be 10 μm or more and 50 μm or less, may be 10 μm or more and 30 μm or less, may be 10 μm or more and 25 μm or less, may be 10 μm or more and 20 μm or less, may be 10 μm or more and 15 μm or less, may be 15 μm or more and 100 μm or less, may be 15 μm or more and 50 μm or less, may be 15 μm or more and 30 μm or less, may be 15 μm or more and 25 μm or less, may be 15 μm or more and 20 μm or less, may be 20 μm or more and 100 μm or less, may be 20 μm or more and 50 μm or less, may be 20 μm or more and 30 μm or less, may be 20 μm or more and 25 μm or less, may be 25 μm or more and 100 μm or less, may be 25 μm or more and 50 μm or less, may be 25 μm or more and 30 μm or less, may be 30 μm or more and 100 μm or less, may be 30 μm or more and 50 μm or less, or may be 50 μm or more and 100 μm or less.

A method of measuring the thickness T of the mask 50 may be a contact measurement method. For the contact measurement method, a length gauge HEIDENHAIN-METRO "MT1271" including a ball bush guide plunger, which is manufactured by HEIDENHAIN, may be used.

The sectional shapes of the through-hole 53 are not limited to the shape illustrated in FIG. 14. A method of forming the through-hole 53 is not limited to etching but may be a different method. For example, the mask 50 may be formed by plating such that the through-hole 53 is formed.

Examples of the material of the mask 50 can include an iron alloy containing nickel. The iron alloy may contain cobalt in addition to nickel. For example, the material of the mask 50 may be an iron alloy containing 30 mass % or more and 54 mass % or less nickel and cobalt in total and 0 mass % or more and 6 mass % or less cobalt. The iron alloy containing nickel or the iron alloy containing nickel and cobalt may be an invar material containing 34 mass % or more and 38 mass % or less nickel, a super invar material containing cobalt in addition to 30 mass % or more and 34 mass % or less nickel, or a low thermal expansion Fe—Ni plating alloy containing 38 mass % or more and 54 mass % or less nickel. The use of these alloys enables the thermal expansion coefficient of the mask 50 to be decreased. For example, in the case where a glass substrate is used as the substrate 110, the thermal expansion coefficient of the mask 50 can be decreased to the level of that of the glass substrate. This inhibits the precision of the dimensions of the deposition layer that is formed on the substrate 110 and the precision of the position thereof from decreasing due to the difference in thermal expansion coefficient between the mask 50 and the substrate 110 in the deposition process.

A mask group 56 will be described. The mask group 56 includes two or more masks 50. According to the present embodiment, the mask group 56 includes the first mask 50A, the second mask 50B, and the third mask 50C described above. A multilayer body obtained by stacking the first mask 50A, the second mask 50B, and the third mask 50C is also referred to as the mask multilayer body 55.

Figure 16:
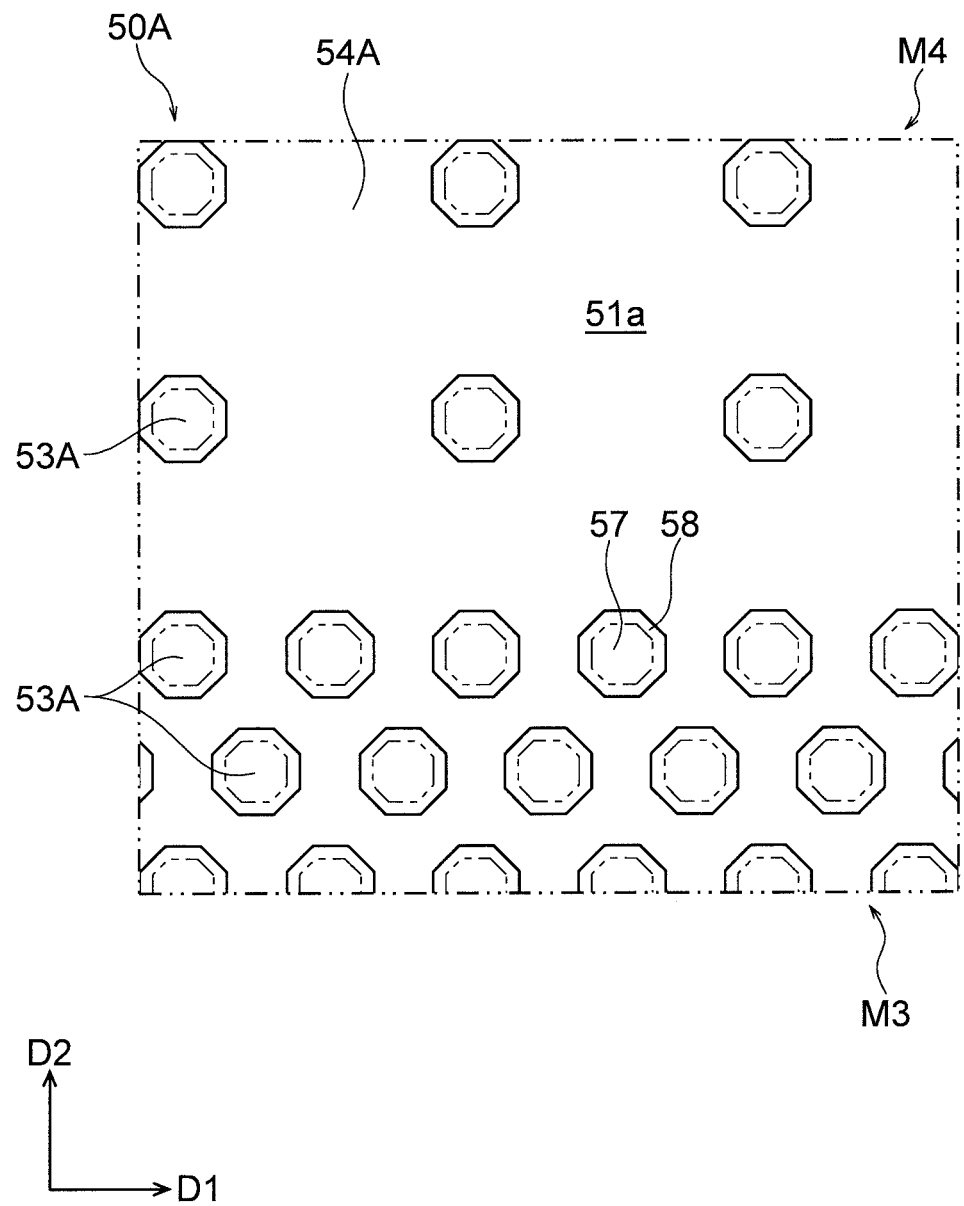
FIG. 16 is a plan view of an example of a first mask for forming the second electrode illustrated in FIG. 3.

The first mask 50A will now be described in detail. FIG. 16 is an enlarged plan view of the third mask region M3 and the fourth mask region M4 on the first surface 51a of the first mask 50A. The first mask 50A includes first through-holes 53A and a first shield region 54A. The first through-holes 53A are arranged in the first mask direction D1 and in the second mask direction D2. In the third mask region M3 and the fourth mask region M4, the first through-holes 53A are located at suitable positions for the first layers 140A of the second electrode 140. The contours of the through-holes 53 illustrated in the plan views in FIG. 16 to FIG. 20 correspond to the contours of the through-holes 53A to 53C on the first surfaces 51a of the masks 50A to 50C. The contours of the through-holes 53A to 53C on the first surfaces 51a correspond to the contours of the first recessed portions 531 on the first surface 51a.

Figure 17:
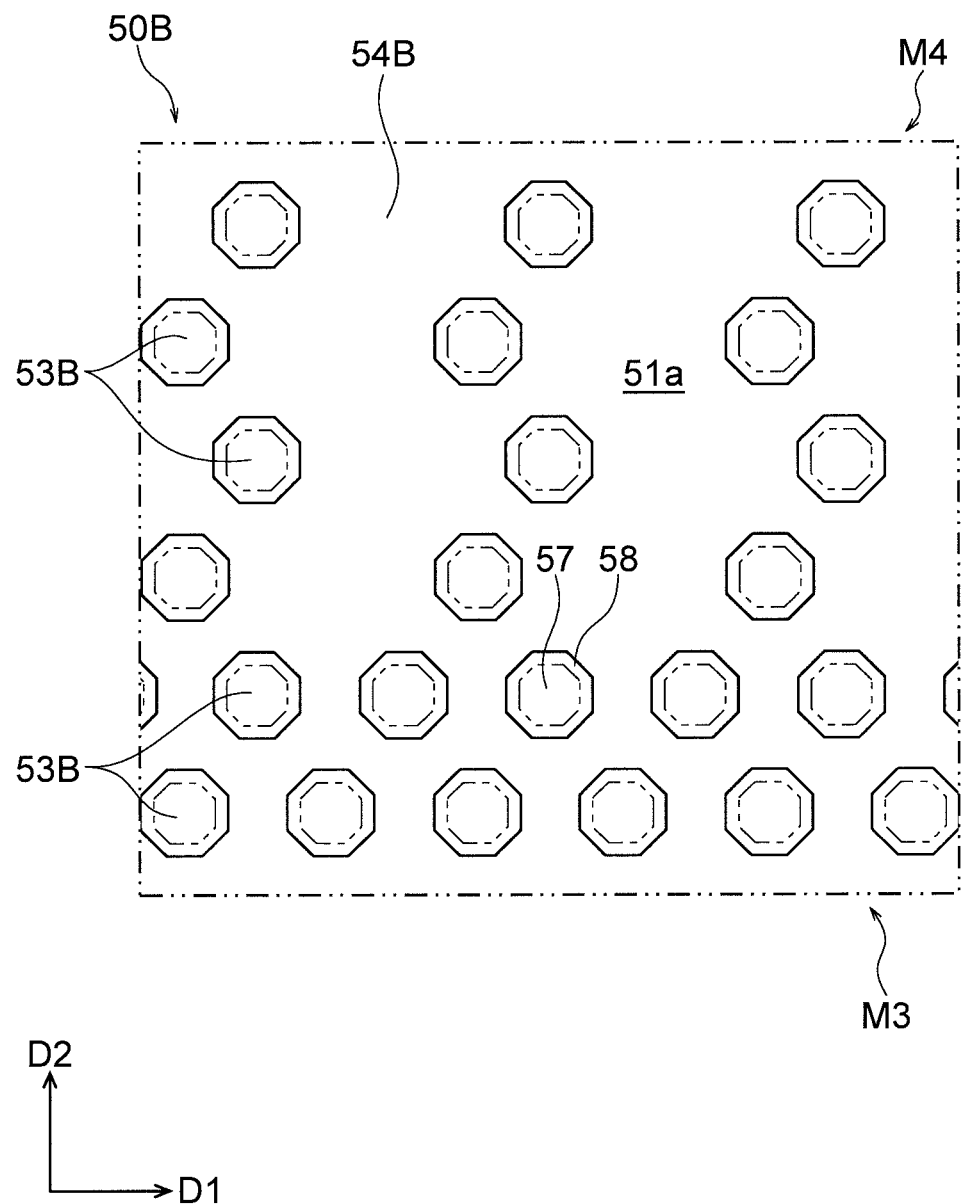
FIG. 17 is a plan view of an example of a second mask for forming the second electrode illustrated in FIG. 3.

Referring to FIG. 17, the second mask 50B will be described. FIG. 17 is an enlarged plan view of the third mask region M3 and the fourth mask region M4 on the first surface 51a of the second mask 50B. The second mask 50B includes second through-holes 53B and has a second shield region 54B. The second through-holes 53B are arranged in the first mask direction D1 and in the second mask direction D2 as in the first through-holes 53A. In the third mask region M3 and the fourth mask region M4, the second through-holes 53B are located at suitable positions for the second layers 140B of the second electrode 140.

Figure 18:
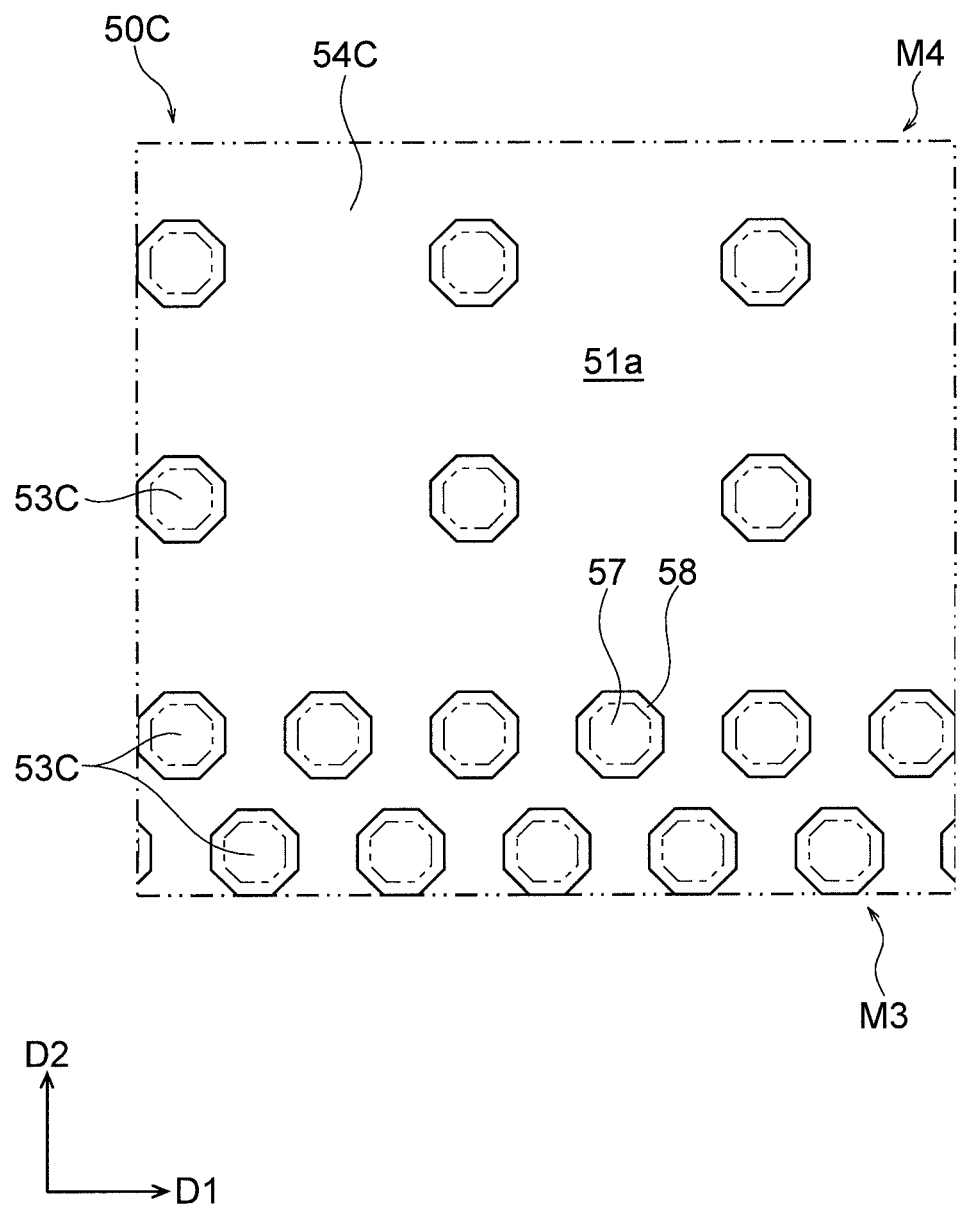
FIG. 18 is a plan view of an example of a third mask for forming the second electrode illustrated in FIG. 3.

Referring to FIG. 18, the third mask 50C will be described. FIG. 18 is an enlarged plan view of the third mask region M3 and the fourth mask region M4 on the first surface 51a of the third mask 50C. The third mask 50C includes third through-holes 53C and a third shield region 54C. The third through-holes 53C are arranged in the first mask direction D1 and in the second mask direction D2 as in the first through-holes 53A. In the third mask region M3 and the fourth mask region M4, the third through-holes 53C are located at suitable positions for the third layers 140C of the second electrode 140.

In a method of measuring the shapes and arrangement of the through-holes 53A to 53C of the masks 50A to 50C, parallel light may be incident on the first surfaces 51a or the second surfaces 51b in the normal direction of the masks 50A to 50C. In this case, the parallel light is emitted from the other of the first surfaces 51a or the second surfaces 51b. The shape of a region that is occupied by the emitted light may be measured as the shapes of the through-holes 53. The shape of the region that is occupied by the emitted light may correspond to the shapes of the through-portions 534 described above.

The shapes and arrangement of the through-holes 53A to 53C on the first surfaces 51a of the masks 50A to 50C may be measured by processing images of the first surfaces 51a. For example, the first surfaces 51a of the masks 50A to 50C may be imaged by using a photographing apparatus, and image data about the contours of the through-holes 53A to 53C on the first surfaces 51a may be obtained.

Figure 19:
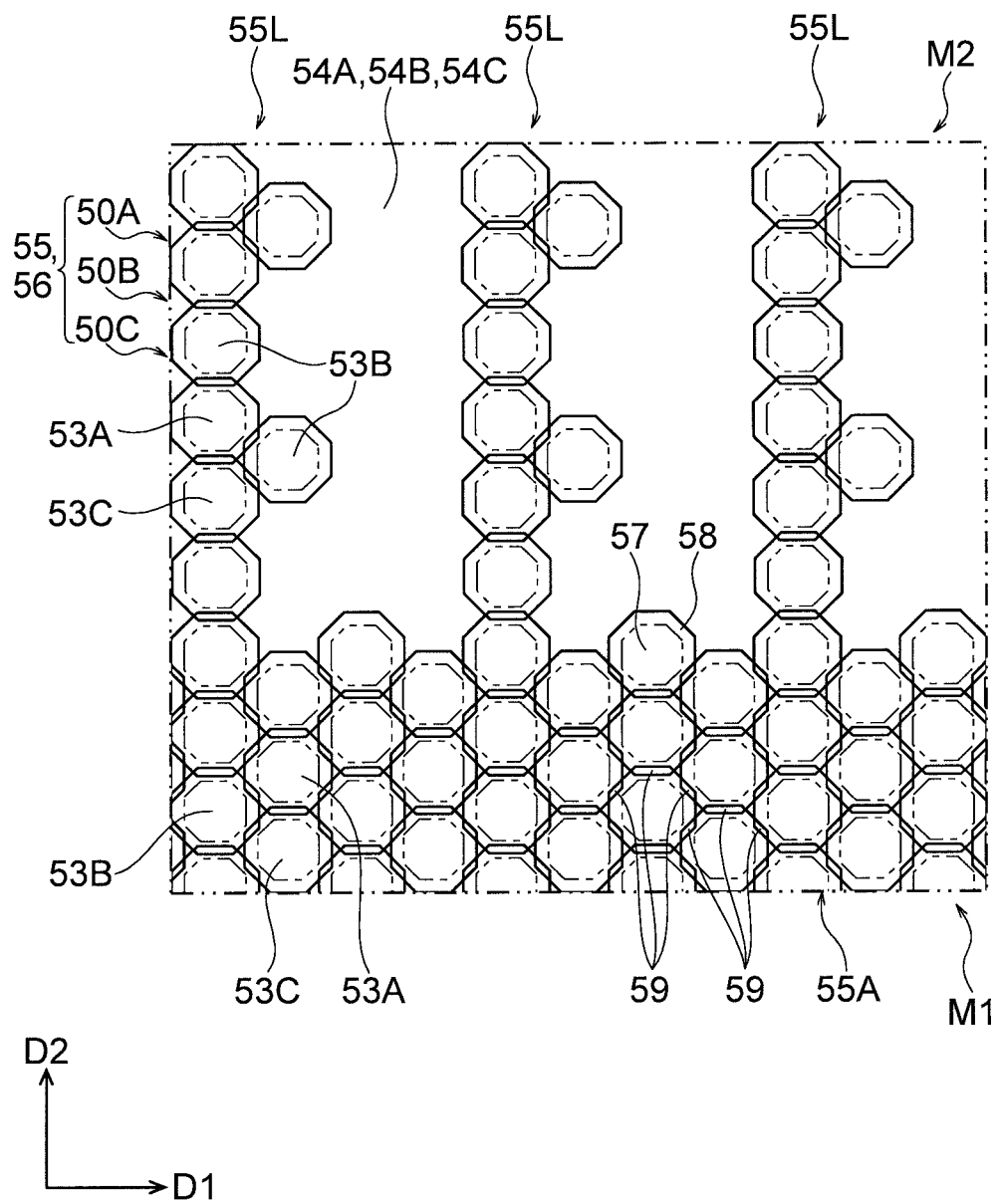
FIG. 19 is a plan view of an example of a mask multilayer body for forming the second electrode illustrated in FIG. 3.

The positional relationship among the first mask 50A, the second mask 50B, and the third mask 50C will be described. FIG. 19 is a plan view of the mask multilayer body 55. The mask multilayer body 55 includes the two or more masks 50 that are stacked. The mask multilayer body 55 illustrated in FIG. 19 includes the first mask 50A, the second mask 50B, and the third mask 50C that are stacked.

As for the mask multilayer body 55, the alignment marks 50M of the masks 50A to 50C may overlap. The masks 50A to 50C may be stacked based on the arrangement of the cells 52 of the masks 50A to 50C. The masks 50A to 50C may be stacked based on the arrangement of the through-holes 53A to 53C and the shield regions 54A to 54C of the masks 50A to 50C. When the masks 50A to 50C are stacked, a tensile force may be applied to the masks 50A to 50C, or a tensile force may not be applied thereto.

The figure in a state in which the two or more masks 50 are stacked may be obtained by superimposing the image data of the masks 50. For example, the image data of the first surfaces 51a of the masks 50A to 50C that is obtained in the above manner by using an image processing apparatus is superimposed. This enables a figure such as FIG. 19 to be obtained. When the image data is obtained, a tensile force may be applied to the masks 50A to 50C, or a tensile force may not be applied thereto. The figure in the state in which the two or more masks 50 are stacked may be obtained by superimposing design drawings for manufacturing the masks 50A to 50C.

As illustrated in FIG. 19, the mask multilayer body 55 includes a penetration region 55A. The penetration region 55A contains at least one of the through-holes 53A to 53C of the masks 50A to 50C in a plan view. That is, the penetration region 55A overlaps at least one of the through-holes 53A to 53C of the masks 50A to 50C in a plan view. Accordingly, the second electrode 140 that have at least a single layer are formed in a region of the substrate 110 corresponding to the penetration region 55A in the deposition process. The penetration region 55A is defined by the contours of the through-holes 53A to 53C on the first surfaces 51a of the masks 50A to 50C.

The mask multilayer body 55 has the first mask region M1 and the second mask region M2 in a plan view. The first mask region M1 corresponds to the first display region 101 of the organic device 100 and overlaps the third mask region M3 of each mask 50 described above. The second mask region M2 corresponds to the second display region 102 of the organic device 100 and overlaps the fourth mask region M4 of each mask 50 described above.

In the first mask region M1, the penetration region 55A has a first aperture ratio. The first aperture ratio represents the area ratio of the penetration region 55A in the first mask region M1. The first aperture ratio is calculated by dividing the total area of the penetration region 55A that is located in the first mask region M1 by the area of the first mask region M1. The first mask region M1 may match the third mask region M3 in a plan view.

The first aperture ratio may be higher than 0% and lower than 100%. In this case, the first mask region M1 includes a region that is occupied by any of the through-holes 53A to 53C and a region that is occupied by none of the through-holes 53A to 53C even with the masks 50A to 50C stacked. However, the present disclosure is not limited thereto, and the first aperture ratio may be 100%. In this case, the entire first mask region M1 is occupied by any of the through-holes 53A to 53C.

In the second mask region M2, the penetration region 55A has a second aperture ratio. The second aperture ratio represents the area ratio of the penetration region 55A in the second mask region M2. The second aperture ratio is calculated by dividing the total area of the penetration region 55A that is located in the second mask region M2 by the area of the second mask region M2. The second mask region M2 may match the fourth mask region M4 in a plan view. The second aperture ratio may be lower than the first aperture ratio.

The second aperture ratio may be higher than 0% and lower than 100%. In this case, the second mask region M2 includes a region that is occupied by any of the through-holes 53A to 53C and a region that is occupied by none of the through-holes 53A to 53C even with the masks 50A to 50C stacked.

For example, the ratio of the second aperture ratio to the first aperture ratio may be 0.2 or more, may be 0.3 or more, or may be 0.4 or more. For example, the ratio of the second aperture ratio to the first aperture ratio may be 0.6 or less, may be 0.7 or less, or may be 0.8 or less. The range of the ratio of the second aperture ratio to the first aperture ratio may be determined by using the first group consisting of 0.2, 0.3, and 0.4 and/or the second group consisting of 0.6, 0.7, and 0.8. The range of the ratio of the second aperture ratio to the first aperture ratio may be determined by using a combination of a value freely selected from the values in the first group described above and a value freely selected from the values in the second group described above. The range of the ratio of the second aperture ratio to the first aperture ratio may be determined by using a combination of two values freely selected from the values in the first group described above. The range of the ratio of the second aperture ratio to the first aperture ratio may be determined by using a combination of two values freely selected from the values in the second group described above. For example, the range may be 0.2 or more and 0.8 or less, may be 0.2 or more and 0.7 or less, may be 0.2 or more and 0.6 or less, may be 0.2 or more and 0.4 or less, may be 0.2 or more and 0.3 or less, may be 0.3 or more and 0.8 or less, may be 0.3 or more and 0.7 or less, may be 0.3 or more and 0.6 or less, may be 0.3 or more and 0.4 or less, may be 0.4 or more and 0.8 or less, may be 0.4 or more and 0.7 or less, may be 0.4 or more and 0.6 or less, may be 0.6 or more and 0.8 or less, may be 0.6 or more and 0.7 or less, or may be 0.7 or more and 0.8 or less.

The penetration region 55A may include hole overlapping regions 59. In the hole overlapping regions 59, the through-holes 53 of the two or more masks 50 overlap in a plan view. That is, the hole overlapping region 59 contains at least two through-holes 53 of the two or more masks 50 that are included in the mask multilayer body 55 in a plan view. More specifically, in the hole overlapping region 59, the through-holes 53 on the first surfaces 51a of the masks 50 overlap.

In an example illustrated in FIG. 19, the hole overlapping region 59 includes a region in which the first through-hole 53A and the second through-hole 53B overlap, a region in which the first through-hole 53A and the third through-hole 53C overlap, and a region in which the second through-hole 53B and the third through-hole 53C overlap in a plan view. Accordingly, the second electrode 140 that has two layers are formed in region of the substrate 110 corresponding to the hole overlapping region 59 in the deposition process. The penetration region 55A may not include a region in which the first through-hole 53A, the second through-hole 53B, and the third through-hole 53C overlap.

Figure 20:
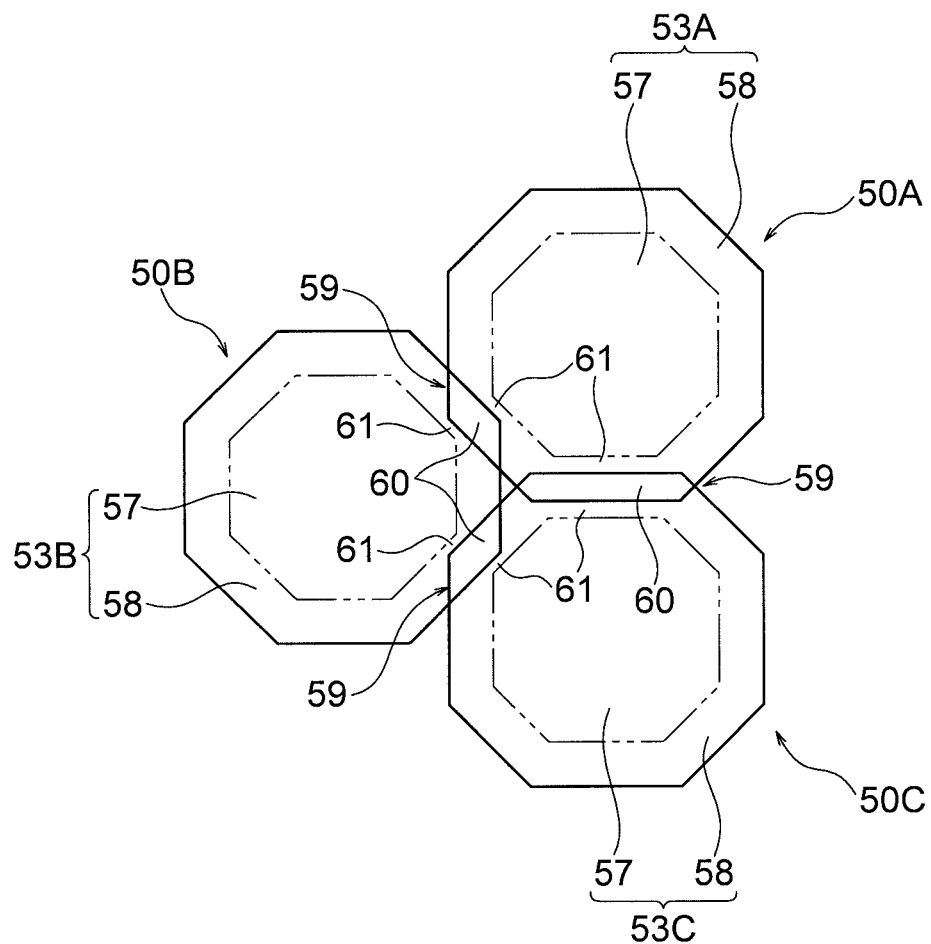
FIG. 20 is a plan view of hole overlapping regions of the mask multilayer body illustrated in FIG. 19.
Figure 21:
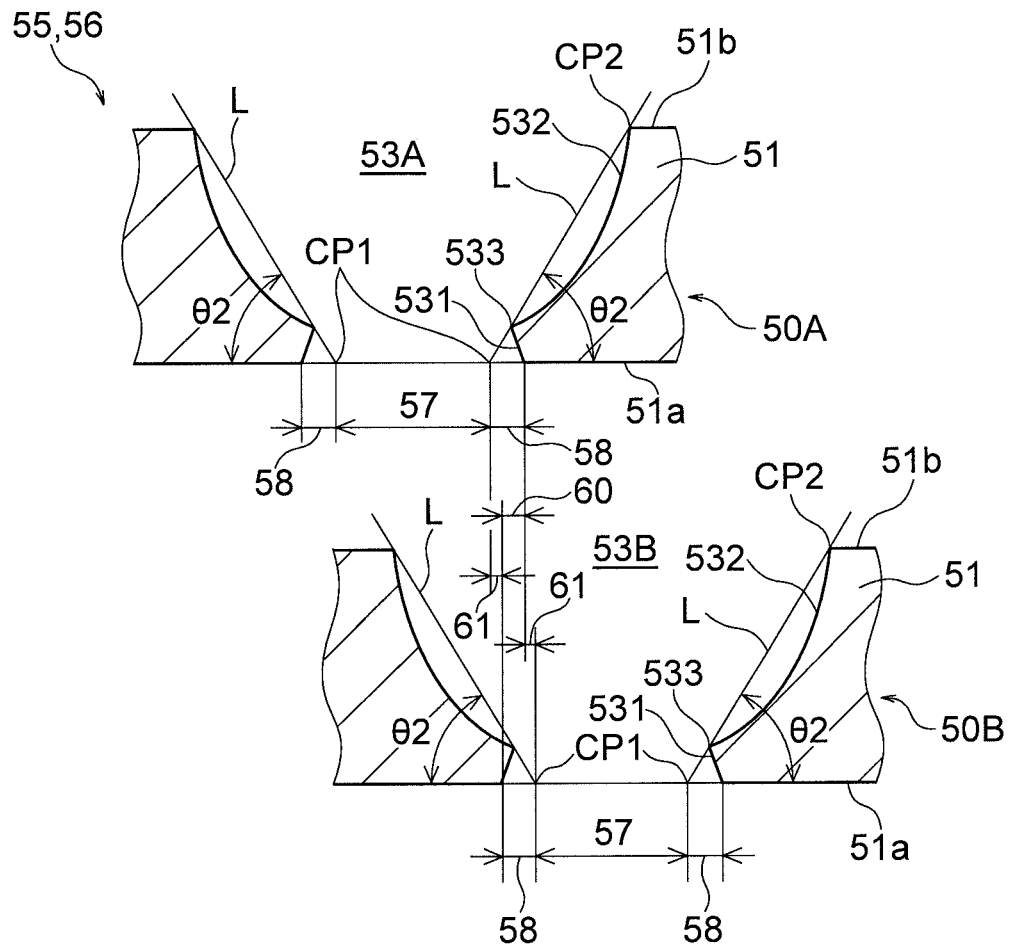
FIG. 21 is a sectional view of the hole overlapping regions illustrated in FIG. 20.

As illustrated in FIG. 20 and FIG. 21, the hole overlapping region 59 may include first hole overlapping region 60 in which the peripheral region 58 of the through-holes 53 of two masks 50 that are included in the mask multilayer body 55 overlap. FIG. 20 is a plan view of the hole overlapping regions 59. FIG. 21 is a sectional view of the hole overlapping regions 59. In an example in FIG. 21, the hole overlapping regions 59 that are formed by the first mask 50A and the second mask 50B are illustrated.

For example, the first hole overlapping region 60 include a region in which the peripheral region 58 of the first through-hole 53A and the peripheral region 58 of the second through-hole 53B overlap, a region in which the peripheral region 58 of the first through-hole 53A and the peripheral region 58 of the third through-hole 53C overlap, and a region in which the peripheral region 58 of the second through-hole 53B and the peripheral region 58 of the third through-hole 53C overlap. According to the present embodiment, the hole overlapping region 59 include the first hole overlapping region 60 in which the peripheral region 58 of the through-holes 53 overlap. According to the present embodiment, the effective region 57 of the through-hole 53 do not overlap the hole overlapping region 59.

The first hole overlapping region 60 may be separated from the effective region 57. Non-overlapping region 61 may be located between the first hole overlapping region 60 and the effective region 57.

For example, the first hole overlapping region 60 in which the peripheral region 58 of the first through-hole 53A and the peripheral region 58 of the second through-hole 53B overlap may be separated from the effective region 57 of the first through-hole 53A. The non-overlapping region 61 may be located between the first hole overlapping region 60 and the effective region 57 of the first through-hole 53A. The first hole overlapping region 60 in which the peripheral region 58 of the first through-hole 53A and the peripheral region 58 of the second through-hole 53B overlap may be separated from the effective region 57 of the second through-hole 53B. The non-overlapping region 61 may be located between the first hole overlapping region 60 and the effective region 57 of the second through-hole 53B.

Similarly, the first hole overlapping region 60 in which the peripheral region 58 of the first through-hole 53A and the peripheral region 58 of the third through-hole 53C overlap may be separated from each of the effective regions 57 of the through-holes 53A and 53C. The non-overlapping region 61 may be located between the first hole overlapping region 60 and each of the effective regions 57 of the through-holes 53A and 53C.

Similarly, the first hole overlapping region 60 in which the peripheral region 58 of the second through-hole 53B and the peripheral region 58 of the third through-hole 53C overlap may be separated from each of the effective regions 57 of the through-holes 53B and 53C. The non-overlapping region 61 may be located between the first hole overlapping region 60 and each of the effective regions 57 of the through-holes 53B and 53C.

When the penetration region 55A includes the first hole overlapping regions 60 described above, the second electrode 140 illustrated in FIG. 7 and FIG. 8 can be formed. The first hole overlapping region 60 correspond to the first electrode overlapping region 149 described above.

The area of the hole overlapping region 59 may be smaller than the area of the first through-hole 53A. For example, the ratio of the area of the hole overlapping region 59 to the area of the first through-hole 53A may be 0.02 or more, may be 0.05 or more, or may be 0.10 or more. For example, the ratio of the area of the hole overlapping region 59 to the area of the first through-hole 53A may be 0.20 or less, may be 0.30 or less, or may be 0.40 or less. The range of the ratio of the area of the hole overlapping region 59 to the area of the first through-hole 53A may be determined by using a first group consisting of 0.02, 0.05, and 0.10 and/or a second group consisting of 0.20, 0.30, and 0.40. The range of the ratio of the area of the hole overlapping region 59 to the area of the first through-hole 53A may be determined by using a combination of a value freely selected from the values in the first group described above and a value freely selected from the values in the second group described above. The range of the ratio of the area of the hole overlapping region 59 to the area of the first through-hole 53A may be determined by using a combination of two values freely selected from the values in the first group described above. The range of the ratio of the area of the hole overlapping region 59 to the area of the first through-hole 53A may be determined by using a combination of two values freely selected from the values in the second group described above. For example, the range may be 0.02 or more and 0.40 or less, may be 0.02 or more and 0.30 or less, may be 0.02 or more and 0.20 or less, may be 0.02 or more and 0.10 or less, may be 0.02 or more and 0.05 or less, may be 0.05 or more and 0.40 or less, may be 0.05 or more and 0.30 or less, may be 0.05 or more and 0.20 or less, may be 0.05 or more and 0.10 or less, may be 0.10 or more and 0.40 or less, may be 0.10 or more and 0.30 or less, may be 0.10 or more and 0.20 or less, may be 0.20 or more and 0.40 or less, may be 0.20 or more and 0.30 or less, or may be 0.30 or more and 0.40 or less.

The area of the hole overlapping region 59 may be smaller than the area of the second through-hole 53B. The range of the ratio of the area of the hole overlapping region 59 to the area of the second through-hole 53B may be the range of the "ratio of the area of the hole overlapping region 59 to the area of the first through-hole 53A" described above.

The area of the hole overlapping region 59 may be smaller than the area of the third through-hole 53C. The range of the ratio of the area of the hole overlapping region 59 to the area of the third through-hole 53C may be the range of the "ratio of the area of the hole overlapping region 59 to the area of the first through-hole 53A" described above.

As illustrated in FIG. 19, the penetration region 55A that is located in the second mask region M2 may include two or more through-lines 55L that are arranged in the first mask direction D1. The through-line 55L may extend in the second mask direction D2. For example, the through-line 55L may have a third end and a fourth end that are connected to the penetration region 55A in the first mask region M1. The fourth end are located opposite the third end in the second mask direction D2.

An example a method of manufacturing the organic device 100 will be described.

The substrate 110 that has the first electrodes 120 are first prepared. For example, the first electrodes 120 are formed in a manner in which a conductive layer for forming the first electrodes 120 is formed on the substrate 110 by, for example, a spattering method, and the conductive layer is subsequently patterned by, for example, a photolithography method. The insulating layer 160 that is located between two first electrodes 120 adjacent to each other in a plan view may be formed on the substrate 110.

Subsequently, as illustrated in FIG. 5 and FIG. 6, the organic layers 130 that include the first organic layers 130A, the second organic layers 130B, and the third organic layers 130C are formed on the first electrodes 120. For example, the first organic layers 130A may be formed by using the deposition method in which a mask that includes the through-holes suitable for the first organic layers 130A is used. For example, the first organic layers 130A can be formed by depositing an organic material on the first electrodes 120 that are associated with the first organic layers 130A by using the mask. The second organic layers 130B may be formed by using the deposition method in which a mask that includes the through-holes suitable for the second organic layers 130B is used. The third organic layers 130C may be formed by using the deposition method in which a mask that includes the through-holes suitable for the third organic layers 130C is used.

Subsequently, a process of forming the second electrode may be performed. In the process of forming the second electrode, the second electrode 140 are formed on the organic layers 130 by using the mask group 56 described above. A process of forming the first layers 140A of the second electrode 140 by using the deposition method in which the first mask 50A is used may be performed. For example, a conductive material such as metal is deposited on, for example, the organic layers 130 by using the first mask 50A. This enables the first layers 140A to be formed. Subsequently, a process of forming the second layers 140B of the second electrode 140 by using the deposition method in which the second mask 50B is used may be performed. For example, a conductive material such as metal is deposited on, for example, the organic layers 130 by using the second mask 50B. This enables the second layers 140B to be formed. Subsequently, a process of forming the third layers 140C of the second electrode 140 by using the deposition method in which the third mask 50C is used may be performed. For example, a conductive material such as metal is deposited on, for example, the organic layers 130 by using the third mask 50C. This enables the third layers 140C to be formed. In this way, as illustrated in FIG. 5 and FIG. 6, the second electrode 140 that include the first layers 140A, the second layers 140B, and the third layers 140C can be formed.

An order in which the first layers 140A, the second layers 140B, and the third layers 140C are formed is not particularly limited. For example, the deposition process may be performed in the order of the third layers 140C, the second layers 140B, and the first layers 140A.

Effect according to the present disclosure will be summarized.

The second electrode 140 in the second display region 102 includes the electrode overlapping region 148 in which the first layer 140A and the second layer 140B overlap, and the electrode overlapping region 148 include the first electrode overlapping region 149 in which the peripheral layer region 142 of the first layer 140A and the peripheral layer region 142 of the second layer 140B overlap. Consequently, the thickness of the second electrode 140 in the first electrode overlapping region 149 can be decreased, and the transmittance in the first electrode overlapping region 149 can be increased. For this reason, the transmittance in the non-transparent region 103 in the second display region 102 can be increased, and the optical transmittance of the second display region 102 can be increased.

The penetration region 55A in the second mask region M2 of the mask multilayer body 55 includes the hole overlapping region 59 in which the through-holes 53 of two masks 50 overlap. The hole overlapping region 59 include the first hole overlapping region 60 in which the peripheral region 58 of the two masks 50 overlap. Consequently, the first electrode overlapping region 149 can be formed such that the thickness of the second electrode 140 can be decreased.

The first electrode overlapping region 149 is separated from the main layer region 141. Consequently, the main layer region 141 can be inhibited from overlapping the first electrode overlapping region 149, and the thickness of the second electrode 140 in the first electrode overlapping region 149 can be decreased.

The first hole overlapping region 60 of the mask multilayer body 55 is separated from the effective region 57. Consequently, the first electrode overlapping region 149 that is separated from the main layer region 141 can be formed.

The masks 50 include the multiple through-holes 53 that are located in the first mask region M1 and the second mask region M2. Consequently, the multiple through-holes 53 can be formed in the third mask regions M3 and the fourth mask regions M4 of the masks 50. For example, the second electrode 140 of the organic device 100 can include the layers 140A to 140C that are formed in patterns corresponding to the through-holes 53A to 53C of the masks 50A to 50C. In this case, the number of the masks 50 for forming the second electrode 140 can be decreased, and the number of times of deposition for forming the second electrode 140 can be decreased. For this reason, the amount of the deposition material 7 used can be decreased, and an environmental load can be decreased. The shield region 54 is formed around the through-holes 53A to 53C in the third mask region M3, and the material of the masks 50A to 50C can be left. For this reason, the mechanical strength of the masks 50A to 50C can be maintained.

The embodiment described above can be modified in various ways. Modifications will now be described with reference to the drawings as needed. In the following description and the drawings that are used for the description, a portion that has the same structure as a portion according to the embodiment described above is designated by reference characters like to the reference characters that are used for the portion according to the embodiment described above, and a duplicated description is omitted. In the case where the action and effect according to the embodiment described above are clearly achieved also according to the modifications, the description thereof is omitted in some cases.

Figure 22:
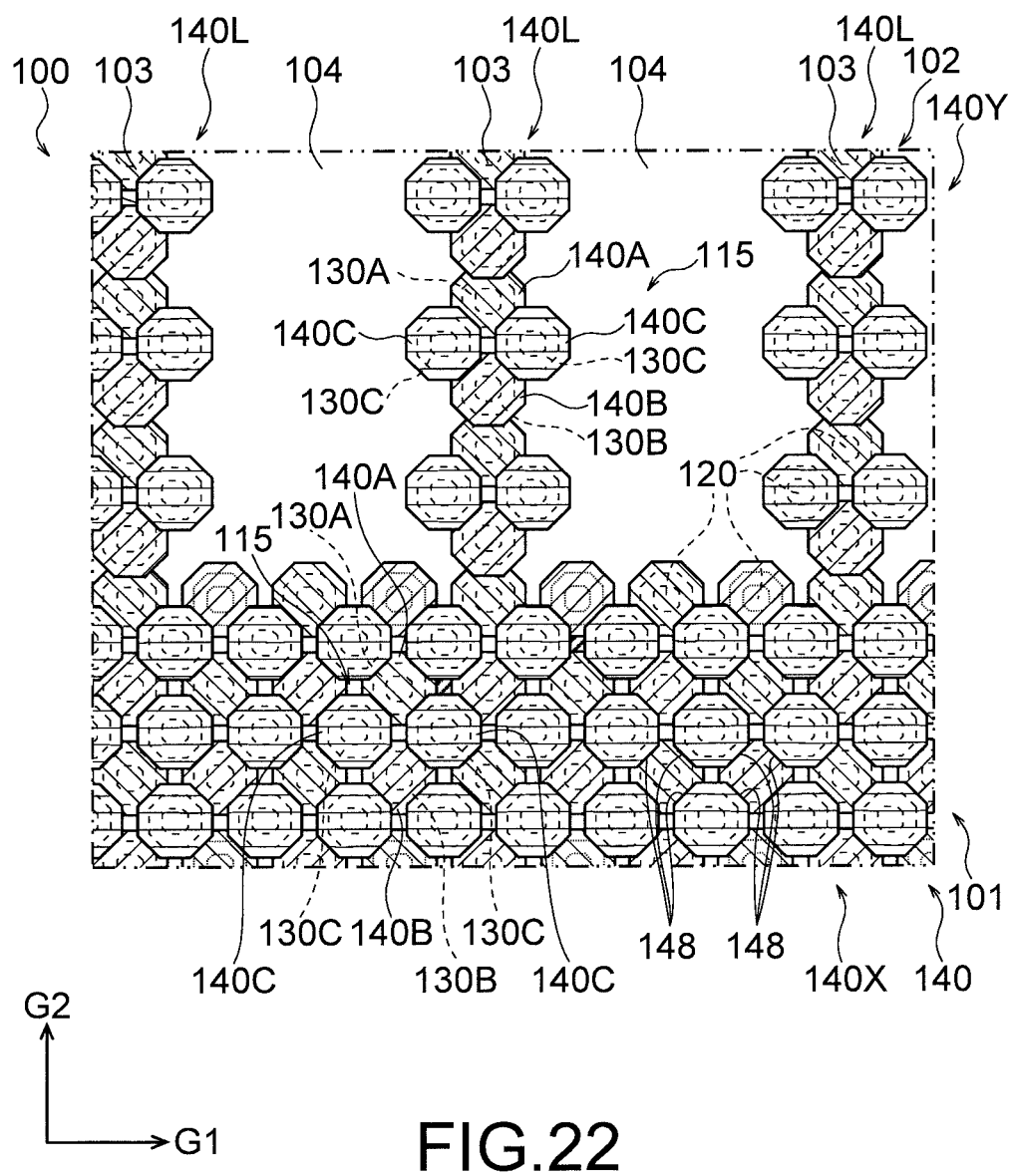
FIG. 22 is a plan view of a modification to the second electrode illustrated in FIG. 3.
Figure 23:
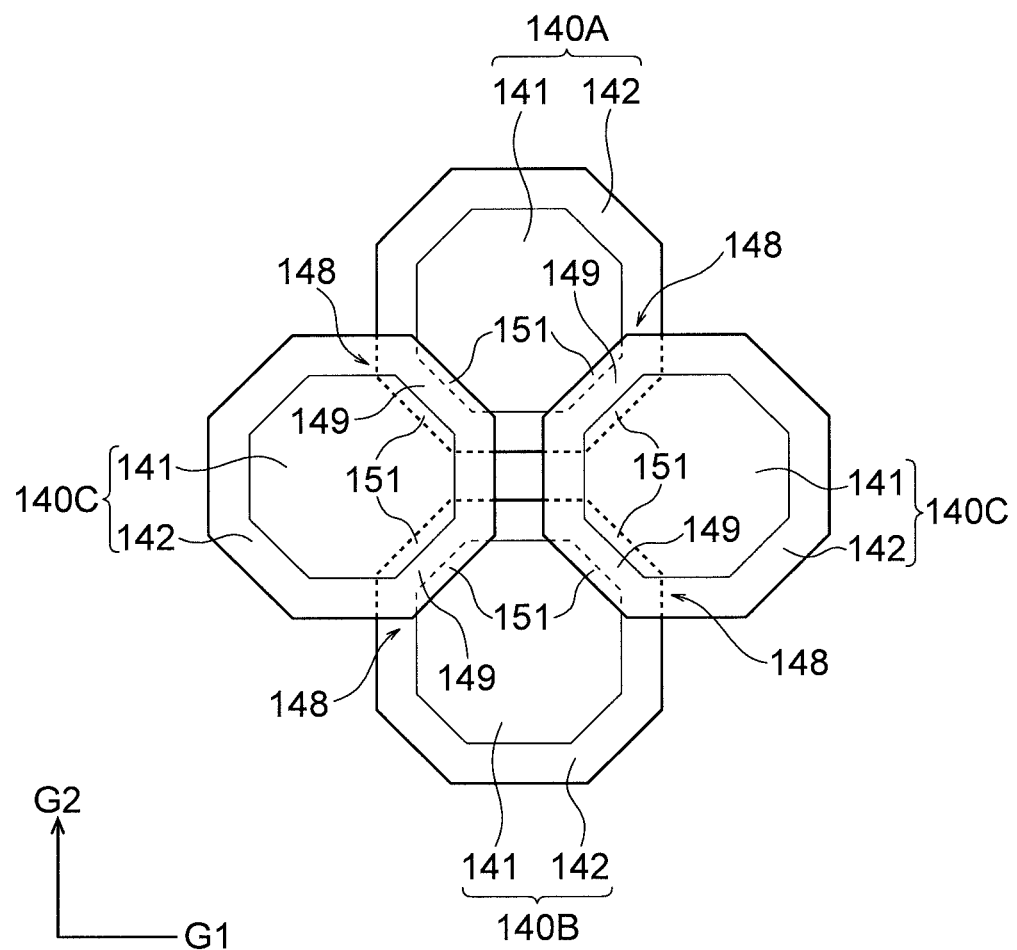
FIG. 23 is a plan view of the electrode overlapping regions of the second electrode illustrated in FIG. 22.
Figure 24:
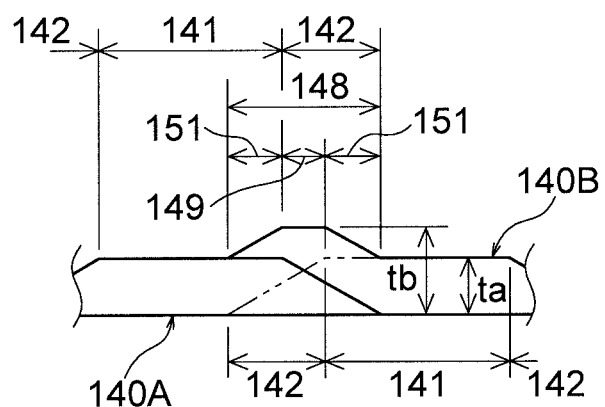
FIG. 24 is a sectional view of the electrode overlapping regions illustrated in FIG. 23.
Figure 25:
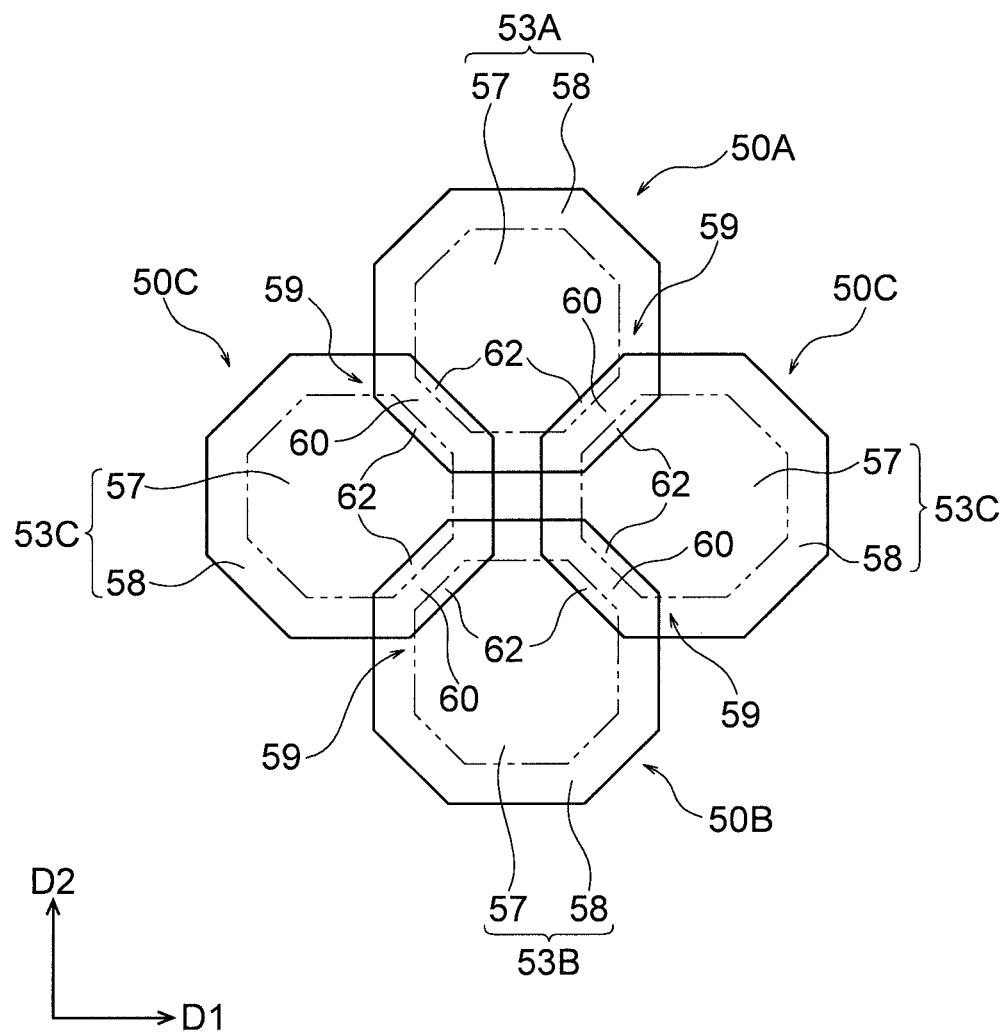
FIG. 25 is a plan view of the hole overlapping regions of the mask multilayer body for forming the second electrode illustrated in FIG. 22.
Figure 26:
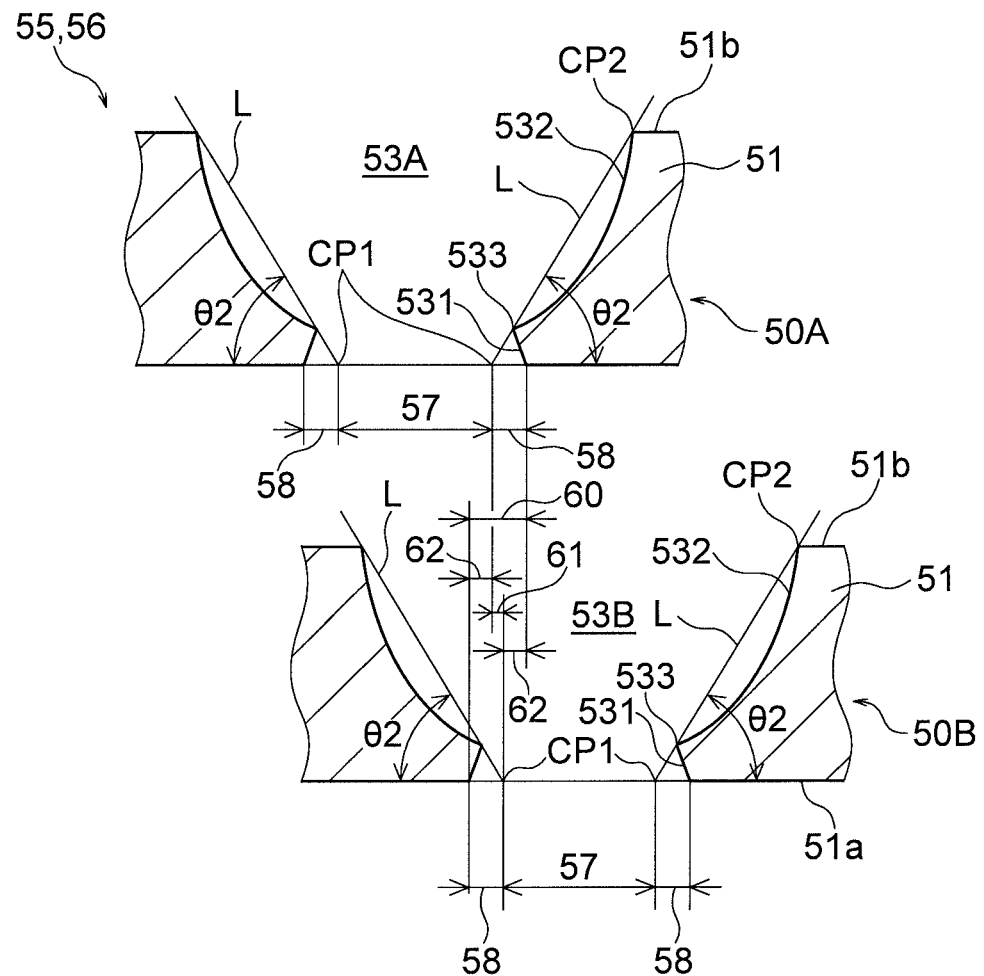
FIG. 26 is a sectional view of the hole overlapping regions illustrated in FIG. 25.

A first modification will be described with reference to FIG. 22 to FIG. 26. FIG. 22 is a plan view of a modification to the second electrode in the second display region. FIG. 23 is a plan view of the electrode overlapping region 148 illustrated in FIG. 22. FIG. 24 is a sectional view of one of the electrode overlapping regions illustrated in FIG. 23. FIG. 25 is a plan view of the hole overlapping regions 59. FIG. 26 is a sectional view of the hole overlapping regions 59 illustrated in FIG. 25.

For example, as illustrated in FIG. 22 to FIG. 24, the electrode overlapping region 148 may include the first electrode overlapping region 149 described above and second electrode overlapping regions 151. The second electrode overlapping region 151 include the main layer region 141 of one of the layers and the peripheral layer region 142 of another layer.

As illustrated in FIG. 22, the second electrode 140 may include the first layers 140A, the second layers 140B, and the third layers 140C. In an example illustrated in FIG. 22, a single first layer 140A, a single second layer 140B, and two third layers 140C are located on the vertices of a rhombus. The two third layers 140C are located on a diagonal that extends in the first element direction G1. The four layers 140A, 140B, and 140C that are arranged as described above and the first electrode 120 and the organic layers 130 described above correspond to a single pixel. In the example illustrated in FIG. 22, a pixel in the first display region 101 and a pixel in the second display region 102 have the same structure.

As illustrated in FIG. 23 and FIG. 24, the second electrode overlapping region 151 includes a region in which the main layer region 141 of the first layer 140A and the peripheral layer region 142 of the second layer 140B overlap and a region in which the peripheral layer region 142 of the first layer 140A and the main layer region 141 of the second layer 140B overlap. For example, the second electrode overlapping region 151 include a region in which the main layer region 141 of the first layer 140A and the peripheral layer region 142 of the third layer 140C overlap and a region in which the peripheral layer region 142 of the first layer 140A and the main layer region 141 of the third layer 140C overlap. For example, the second electrode overlapping region 151 include a region in which the main layer region 141 of the second layer 140B and the peripheral layer region 142 of the third layer 140C overlap and a region in which the peripheral layer region 142 of the second layer 140B and the main layer region 141 of the third layers 140C overlap. The main layer regions 141 of the layers 140A to 140C do not overlap.

As illustrated in FIG. 24, the main layer region 141 and the peripheral layer region 142 overlap, and the thickness tb of the second electrode 140 in the electrode overlapping region 148 can be consequently increased. Consequently, the sectional area of the electrode overlapping region 148 can be increased, and the electric resistance of the electrode overlapping region 148 can be decreased. However, in the case where the main layer regions 141 do not overlap, the thickness tb of the second electrode 140 in the electrode overlapping region 148 can be less than twice the thickness to of the main layer region 141.

The mask group 56 for forming the second electrode 140 illustrated in FIG. 22 to FIG. 24 will be described with reference to FIG. 25 and FIG. 26. FIG. 26 illustrates the hole overlapping regions 59 that are formed by the first mask 50A and the second mask 50B by way of example.

As illustrated in FIG. 25 and FIG. 26, the hole overlapping region 59 of the mask multilayer body 55 may include the first hole overlapping region 60 described above and second hole overlapping region 62. The second hole overlapping region 62 include the effective region 57 of the through-hole 53 of one of the mask 50 that are included in the mask multilayer body 55 and the peripheral region 58 of the through-hole 53 of another mask 50.

For example, the second hole overlapping region 62 includes a region in which the effective region 57 of the first through-hole 53A and the peripheral region 58 of the second through-hole 53B overlap and a region in which the peripheral region 58 of the first through-hole 53A and the effective region 57 of the second through-hole 53B overlap. For example, the second hole overlapping region 62 includes a region in which the effective a region 57 of the first through-hole 53A and the peripheral region 58 of the third through-hole 53C overlap and a region in which the peripheral region 58 of the first through-hole 53A and the effective region 57 of the third through-hole 53C overlap. For example, the second hole overlapping region 62 include a region in which the effective region 57 of the second through-hole 53B and the peripheral region 58 of the third through-hole 53C overlap and a region in which the peripheral region 58 of the second through-hole 53B and the effective region 57 of the third through-hole 53C overlap. The effective region 57 of the masks 50 do not overlap.

The penetration region 55A include the first hole overlapping regions 60 and the second hole overlapping regions 62 described above, and the electrode overlapping region 148 of the second electrode 140 illustrated in FIG. 23 and FIG. 24 can be consequently formed. The first hole overlapping region 60 corresponds to the first electrode overlapping region 149 described above. The second hole overlapping region 62 corresponds to the second electrode overlapping region 151 described above.

Figure 27:
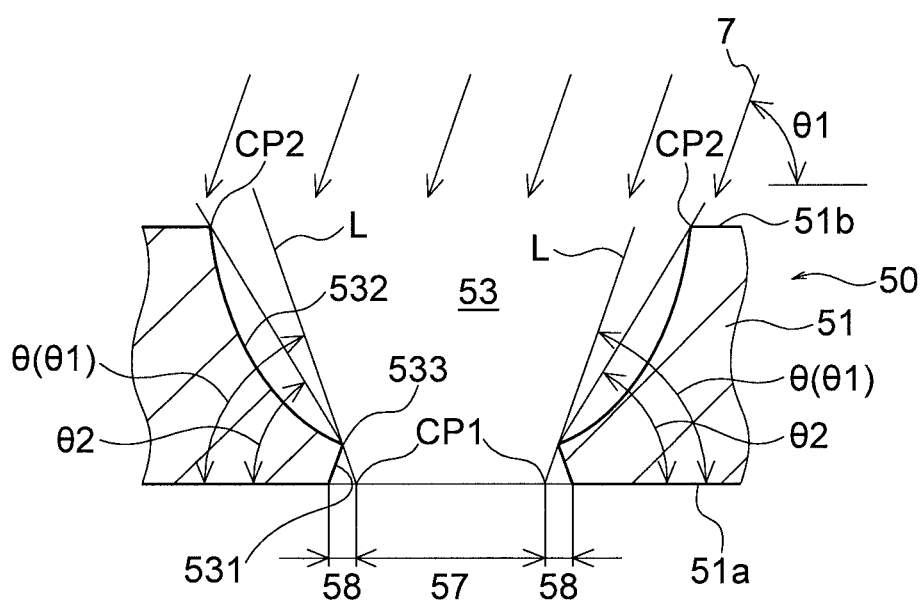
FIG. 27 is a sectional view of a modification to the effective region and the peripheral region of the through-hole illustrated in FIG. 15.

A second modification will be described with reference to FIG. 27. FIG. 27 is a sectional view of a modification to the effective region 57 and the peripheral region 58 of the mask 50.

In an example illustrated in FIG. 27, the region-defining straight line L are defined by using the coming direction in which the deposition material 7 comes.

More specifically, as illustrated in FIG. 27, the coming angle θ1 is larger than the mask angle θ2. In this case, the peripheral region 58 that is likely to be affected by the shadow depend on the coming angle θ1. For this reason, the angle θ of the region-defining straight line L may be equal to the coming angle θ1. In this case, the region-defining straight line L are straight line that passes through the connection portion 533 and that form the angle θ1 together with the first surface 51a. In an example illustrated in FIG. 27, the width of the peripheral region 58 is expressed as the sectional height h/tan θ1.

As for the angle θ of the region-defining straight line L illustrated in FIG. 27, the same numeral example as the angle θ of the region-defining straight line L illustrated in FIG. 15 may be used.

Figure 28:
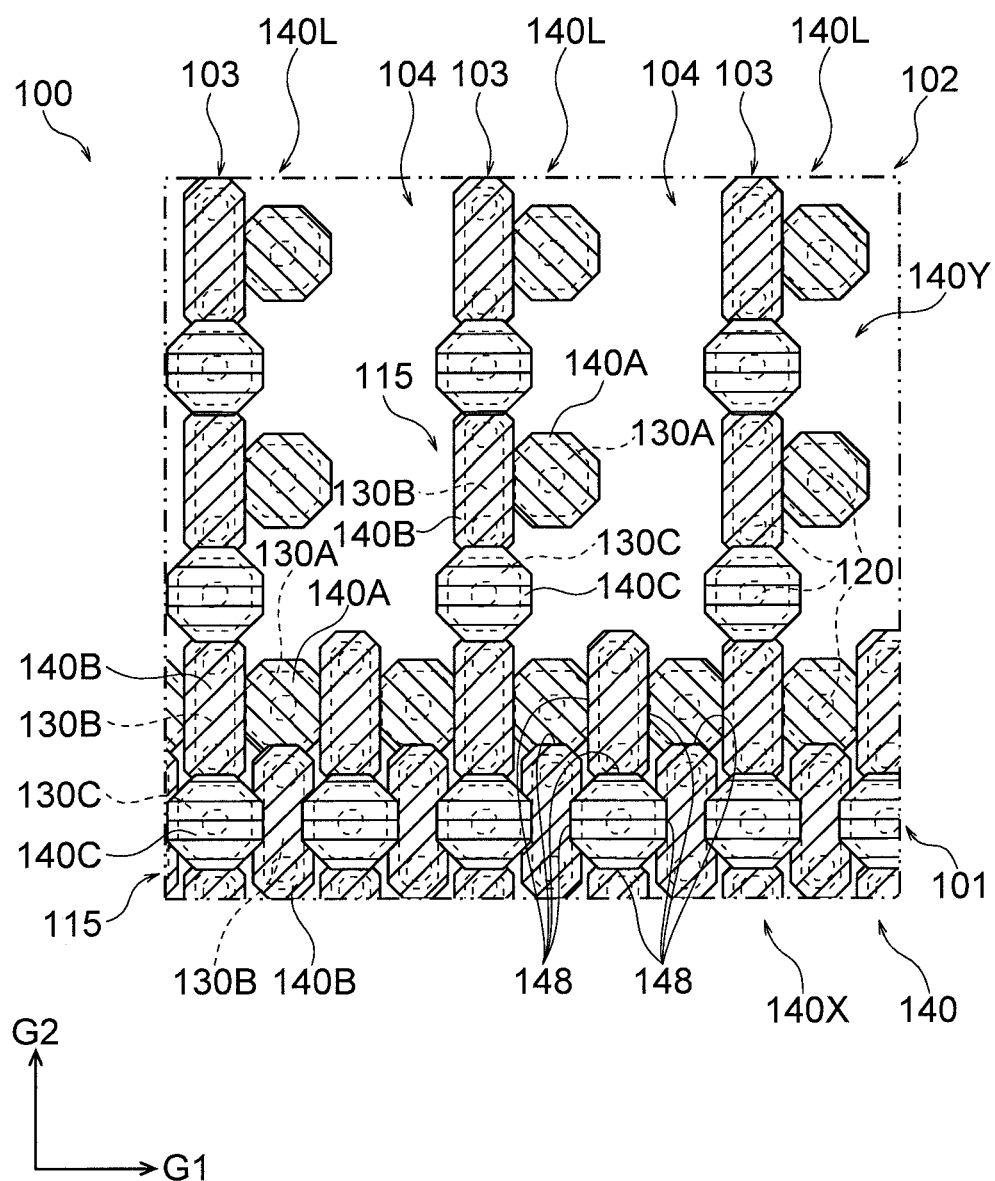
FIG. 28 is a plan view of a modification to the second electrode illustrated in FIG. 3.
Figure 29:
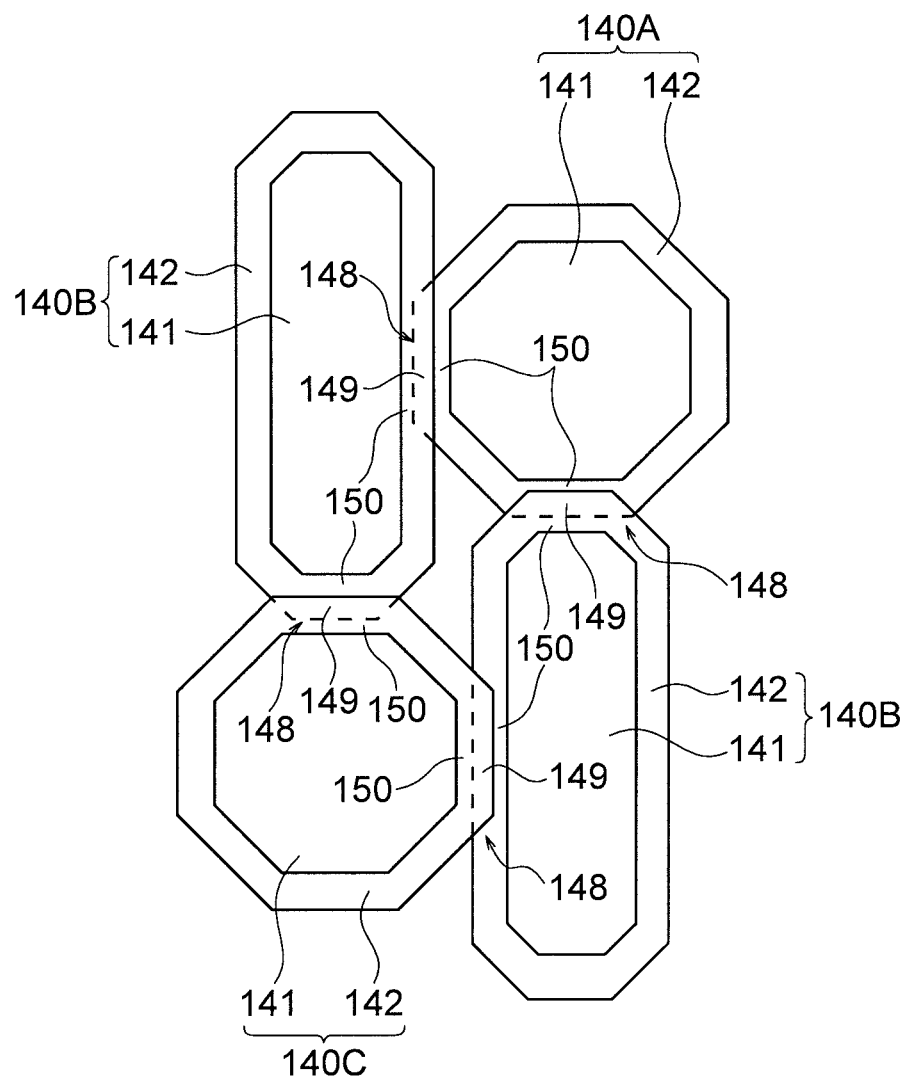
FIG. 29 is a plan view of the electrode overlapping regions of the second electrode illustrated in FIG. 28.
Figure 30:
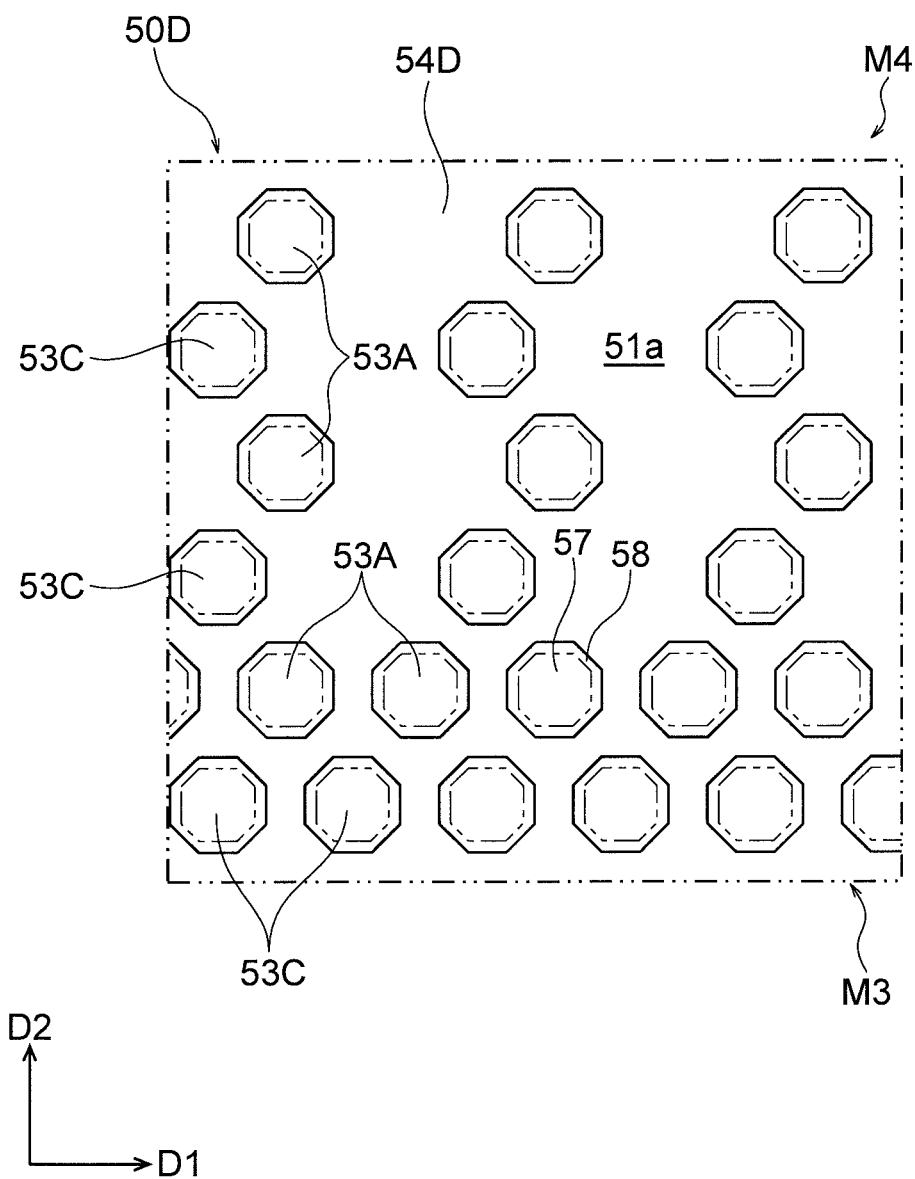
FIG. 30 is a plan view of an example of the first mask for forming the second electrode illustrated in FIG. 28.
Figure 31:
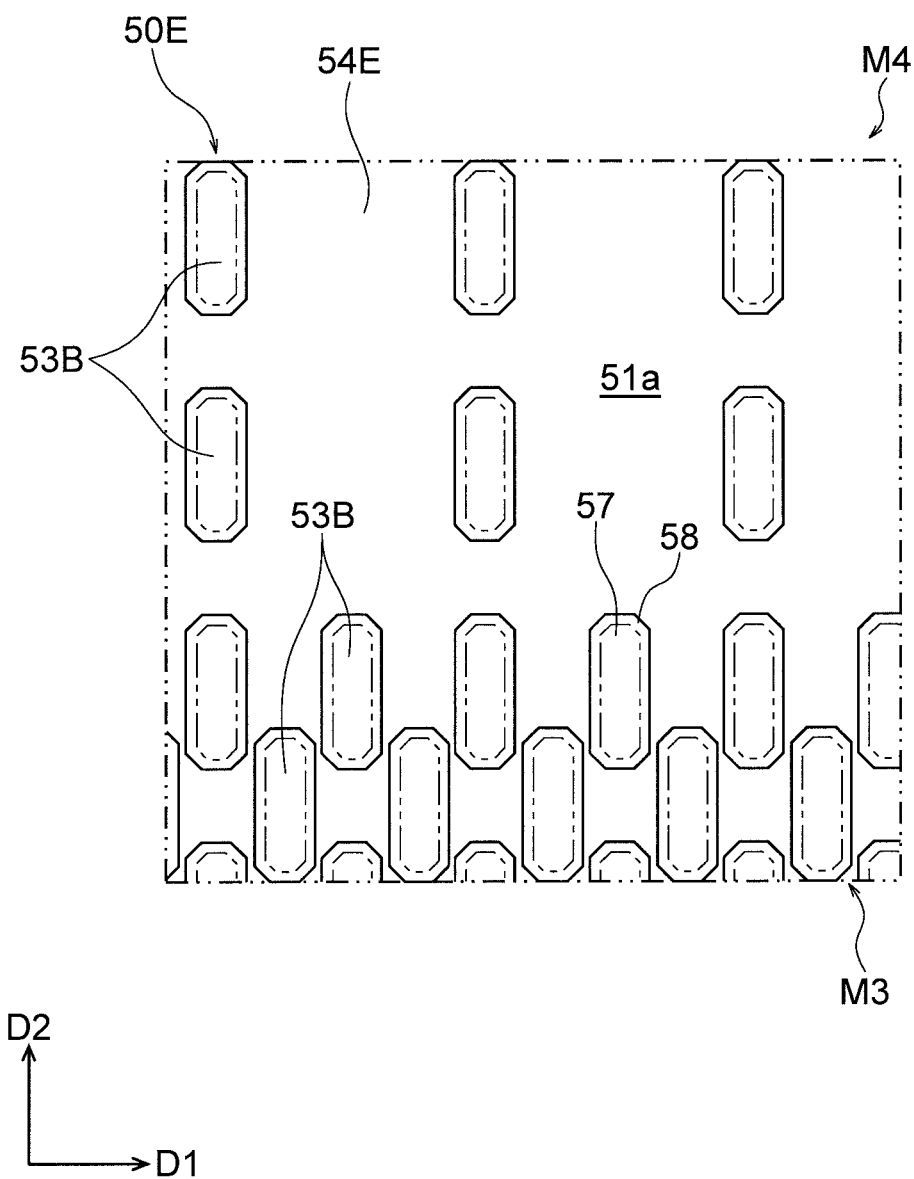
FIG. 31 is a plan view of an example of the second mask for forming the second electrode illustrated in FIG. 28.
Figure 32:
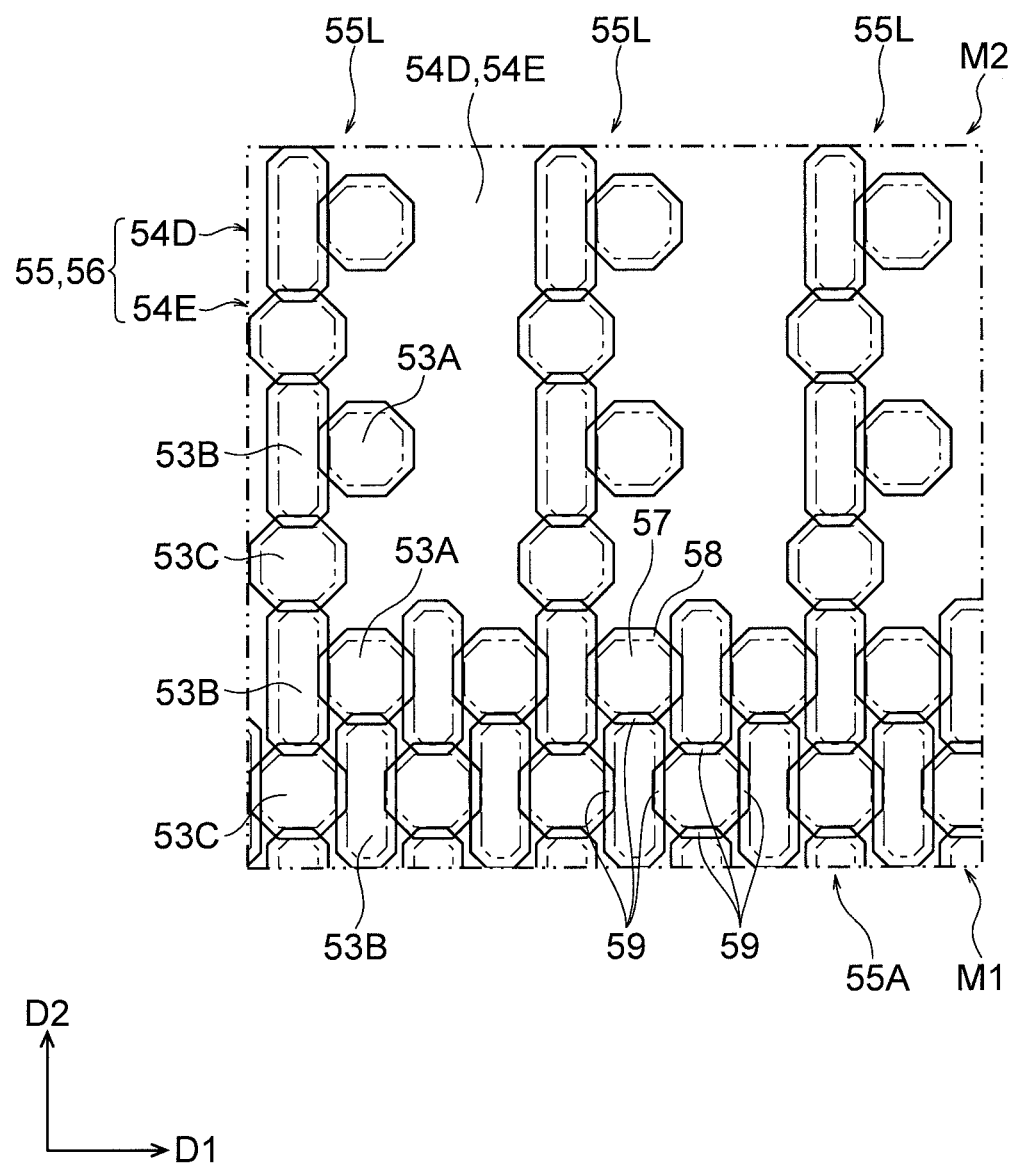
FIG. 32 is a plan view of the hole overlapping regions of the mask multilayer body for forming the second electrode illustrated in FIG. 28.
Figure 33:
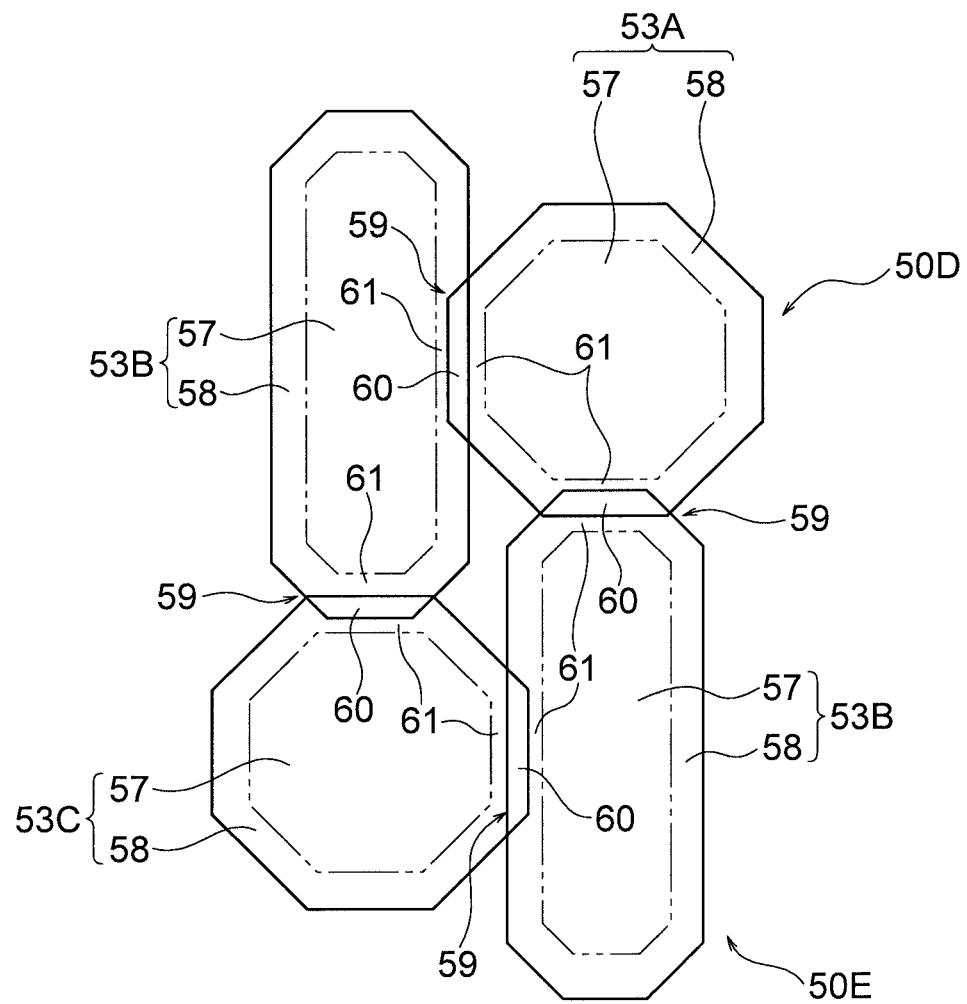
FIG. 33 is a plan view of the hole overlapping regions of the mask multilayer body illustrated in FIG. 32.

A third modification will be described with reference to FIG. 28 to FIG. 33. FIG. 28 is a plan view of a modification to the second electrode. FIG. 29 is a plan view of the electrode overlapping region. FIG. 30 is a plan view of a first mask. FIG. 31 is a plan view of a second mask. FIG. 32 is a plan view of the mask multilayer body. FIG. 33 is a plan view of the hole overlapping regions of the mask multilayer body.

In an example illustrated in FIG. 28, the second electrode 140 may include the first layers 140A, the second layers 140B, and the third layers 140C. The first layers 140A and the third layers 140C are formed by using the deposition method in which a first mask 50D is used. The second layers 140B are formed by using the deposition method in which a second mask 50E is used.

The first layers 140A and the third layers 140C have a contour that has a substantially regular octagonal shape. The first layers 140A and the third layers 140C may have the same planar contour. The second layers 140B may have a planar contour that differs from those of the first layers 140A and the third layers 140C. The second layers 140B may have a contour that has a substantially octagonal shape that has a longitudinal direction. The longitudinal direction of the second layers 140B illustrated in FIG. 28 coincides with the second element direction G2. Alternatively, the second layers 140B may have a contour that has a substantially quadrilateral shape that has a longitudinal direction that coincides with the second element direction G2. In this case, four corners of the contour of each second layer 140B may be chamfered.

In the first display region 101, the first layers 140A, the second layers 140B, and the third layers 140C may be continuously arranged in the first element direction G1 and in the second element direction G2. In the example illustrated in FIG. 28, a first layer 140A, two second layers 140B, and a third layer 140C are located on the vertices of a quadrilateral shape. The two second layers 140B are located on a diagonal. The four layers 140A, 140B, 140B, and 140C that are arranged as described above, the first electrode 120, and the organic layer 130 described above correspond to a single pixel.

In the second display region 102, the first layers 140A, the second layers 140B, and the third layers 140C may be continuously arranged in the first element direction G1 and in the second element direction G2. In the example illustrated in FIG. 28, each of pixels in the second display region 102 has a structure obtained by removing one of the two second layers 140B of a pixel in the first display region 101. The pixels in the second display region 102 are arranged at an interval in the first element direction G1, and the transparent regions 104 are interposed between the adjacent pixels in the first element direction G1. The pixels in the second display region 102 are continuously arranged in the second element direction G2.

As illustrated in FIG. 29, the electrode overlapping region 148 of the second electrode 140 may include the first electrode overlapping region 149 in which the peripheral layer region 142 of the layers overlap as in the examples illustrated in FIG. 7 and FIG. 8. The non-overlapping region 150 may be located between the first electrode overlapping region 149 and the main layer region 141.

The mask group 56 for forming the second electrode 140 illustrated in FIG. 28 will be described with reference to FIG. 30 to FIG. 33. FIG. 30 is an enlarged plan view of the third mask region M3 and the fourth mask region M4 on the first surface 51a of the first mask 50D. FIG. 31 is an enlarged plan view of the third mask region M3 and the fourth mask region M4 on the first surface 51a of the second mask 50E. FIG. 32 is a plan view of the hole overlapping region 59. FIG. 33 is a sectional view of the hole overlapping region 59.

The mask group 56 according to the third modification includes the first mask 50D and the second mask 50E. According to the third modification, the mask multilayer body 55 is obtained by stacking the first mask 50D and the second mask 50E.

As illustrated in FIG. 30, the first mask 50D includes the first through-holes 53A, the third through-holes 53C, and a first shield region 54D. The first through-holes 53A and the third through-holes 53C are arranged in the first mask direction D1 and in the second mask direction D2. In the third mask region M3 and the fourth mask region M4, the first through-holes 53A are located at suitable positions for the first layers 140A of the second electrode 140, and the third through-holes 53C are located at suitable positions for the third layers 140C of the second electrode 140. The contours of the through-holes 53A to 53C illustrated in the plan views in FIG. 30 to FIG. 33 are the contours of the through-holes 53A to 53C on the first surfaces 51a of the masks 50D and 50E. The contours of the through-holes 53A to 53C on the first surfaces 51a correspond to the contours of the first recessed portions 531 on the first surfaces 51a.

As illustrated in FIG. 31, the second mask 50E includes the second through-holes 53B and a second shield region 54E. The second through-holes 53B are arranged in the first mask direction D1 and in the second mask direction D2. In the third mask region M3 and the fourth mask region M4, the second through-holes 53B are located at suitable positions for the second layers 140B of the second electrode 140.

The first through-holes 53A and the third through-holes 53C have a contour that has a substantially regular octagonal shape. The first through-holes 53A and the third through-holes 53C may have the same planar contour. The second through-holes 53B may have a planar contour that differs from those of the first through-holes 53A and the third through-holes 53C. The second through-holes 53B may have a contour that has a substantially octagonal shape that has a longitudinal direction. The longitudinal direction of the second through-hole 53B illustrated in FIG. 31 coincides with the second mask direction D2. Alternatively, the second through-holes 53B may have a contour that has a substantially quadrilateral shape that has a longitudinal direction that coincides with the second mask direction D2. In this case, four corners of the contour of each second through-hole 53B may be chamfered.

As illustrated in FIG. 32, the mask multilayer body 55 has the penetration region 55A. The penetration region 55A contains at least one of the through-holes 53A to 53C of the masks 50D and 50E in a plan view. That is, the penetration region 55A overlap at least one of the through-holes 53A to 53C of the masks 50D and 50E in a plan view.

As illustrated in FIG. 32, the penetration region 55A may include the hole overlapping regions 59 as in the example illustrated in FIG. 19. As illustrated in FIG. 33, the hole overlapping region 59 may include the first hole overlapping region 60 as in the examples illustrated in FIG. 20 and FIG. 21. The non-overlapping region 61 may be located between the first hole overlapping region 60 and the effective region 57.

The modifications to the embodiment described above are described. Naturally, the multiple modifications can be appropriately combined and used.

The invention claimed is:

1. A mask group comprising:
two or more masks,
wherein each of the two or more masks includes a shield region and a through-hole,
wherein a mask multilayer body in which the two or more masks are stacked has a penetration region that overlaps the through-hole when viewed in a normal direction of a mask of the two or more masks,
wherein the mask multilayer body has a first mask region that contains the penetration region that has a first aperture ratio and a second mask region that contains the penetration region that has a second aperture ratio lower than the first aperture ratio when viewed in the normal direction of the mask,
wherein each mask of the two or more masks has a first surface and a second surface that is located opposite the first surface,
wherein the through-hole includes a first recessed portion that is located at the first surface, a second recessed portion that is located at the second surface, and a connection portion at which the first recessed portion and the second recessed portion are connected to each other,
wherein when a section in the normal direction is viewed, a region-defining straight line is defined as a straight line that passes through the connection portion and that forms an angle θ together with the first surface, the region-defining straight line intersects the first surface at a first intersection point, an effective region is defined as a region inside the first intersection point in the through-hole, and a peripheral region is defined as a region outside the first intersection point in the through-hole,
wherein the angle θ is 35° or more and 70° or less,
wherein the penetration region in the second mask region includes a hole overlapping region in which through-holes of two masks of the two or more masks overlap,
wherein the hole overlapping region includes a first hole overlapping region in which the peripheral regions of the through-holes of the two masks that are included in the mask multilayer body overlap, and
wherein effective regions of the through-holes forming the first hole overlapping region do not overlap.

2. The mask group according to claim 1, wherein the first hole overlapping region is separated from the effective region of the through-holes of the mask.

3. The mask group according to claim 1, wherein the hole overlapping region includes a second hole overlapping region in which the effective region of the through-hole of one of the masks that are included in the mask multilayer body and the peripheral region of the through-hole of another of the masks overlap.

4. The mask group according to claim 1, wherein the region-defining straight line is in contact with a freely selected point on a wall surface of the second recessed portion.

5. The mask group according to claim 1, wherein the two or more masks include a plurality of the through-holes in the first mask region and the second mask region.

\* \* \* \* \*